(12) United States Patent
Ishii et al.

(10) Patent No.: US 9,492,910 B2
(45) Date of Patent: Nov. 15, 2016

(54) POLISHING METHOD

(71) Applicant: EBARA CORPORATION, Tokyo (JP)

(72) Inventors: Yu Ishii, Tokyo (JP); Hiroyuki Kawasaki, Tokyo (JP); Masayuki Nakanishi, Tokyo (JP); Kenya Ito, Tokyo (JP); Kenji Kodera, Tokyo (JP); Michiyoshi Yamashita, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 14/823,967

(22) Filed: Aug. 11, 2015

(65) Prior Publication Data

US 2016/0052107 A1 Feb. 25, 2016

Related U.S. Application Data

(63) Continuation-in-part of application No. 13/950,066, filed on Jul. 24, 2013, now Pat. No. 9,393,595.

(30) Foreign Application Priority Data

Jul. 25, 2012 (JP) .................................. 2012-164417
Aug. 21, 2014 (JP) .................................. 2014-168363

(51) Int. Cl.
*B24B 9/00* (2006.01)
*B24D 11/00* (2006.01)
*B24B 21/00* (2006.01)
*B24B 21/08* (2006.01)
(Continued)

(52) U.S. Cl.
CPC ............. *B24D 11/001* (2013.01); *B24B 9/065* (2013.01); *B24B 21/002* (2013.01); *B24B 21/004* (2013.01); *B24B 21/008* (2013.01); *B24B 21/08* (2013.01); *B24B 21/18* (2013.01); *B24B 27/0076* (2013.01); *B24B 49/12* (2013.01); *H01L 21/304* (2013.01); *H01L 21/3105* (2013.01)

(58) Field of Classification Search
CPC ... B24D 11/001; B24B 9/065; B24B 21/002; B24B 21/004; B24B 21/008; B24B 21/18; B24B 27/0076; B24B 49/12; H01L 21/304; H01L 21/3105
USPC .......................................................... 451/41
See application file for complete search history.

(56) References Cited

U.S. PATENT DOCUMENTS 3,812,082 A 5/1974 Jones
4,729,771 A 3/1988 Kunimoto et al.
(Continued)

FOREIGN PATENT DOCUMENTS

JP 03260177 A * 11/1991
JP 06-278037 10/1994
(Continued)

*Primary Examiner* — George Nguyen
(74) *Attorney, Agent, or Firm* — Baker & Hostetler LLP

(57) ABSTRACT

There is disclosed a method of polishing a peripheral portion of a wafer having a hard film with use of an abrasive film while preventing damage to the abrasive film. The polishing method uses an abrasive film including a base film made of polyimide, a binder made of polyimide, and abrasive grains held by the binder. The polishing method includes: rotating a silicon substrate having a surface on which a silicon carbide film is formed; and removing the silicon carbide film from a peripheral portion of the silicon substrate by pressing the abrasive film at a low force against the silicon carbide film on the peripheral portion of the silicon substrate.

5 Claims, 32 Drawing Sheets

(51) Int. Cl.
  *B24B 21/18*      (2006.01)
  *B24B 27/00*      (2006.01)
  *B24B 49/12*      (2006.01)
  *B24B 9/06*       (2006.01)
  *H01L 21/304*     (2006.01)
  *H01L 21/3105*    (2006.01)

(56) References Cited

U.S. PATENT DOCUMENTS

| | | | |
|---|---|---|---|
| 4,927,431 A | 5/1990 | Buchanan et al. | |
| 4,974,373 A * | 12/1990 | Kawashima | B24D 11/00 |
| | | | 51/293 |
| 5,536,202 A * | 7/1996 | Appel | B24B 53/017 |
| | | | 451/285 |
| 5,681,361 A | 10/1997 | Sanders, Jr. | |
| 5,681,612 A * | 10/1997 | Benedict | B24D 3/28 |
| | | | 427/202 |
| 5,766,065 A | 6/1998 | Hasegawa et al. | |
| 6,291,054 B1 * | 9/2001 | Thomas | A47J 36/02 |
| | | | 427/384 |
| 6,340,519 B1 | 1/2002 | Tanaka et al. | |
| 8,556,682 B2 * | 10/2013 | Hall | G02B 6/25 |
| | | | 225/96.5 |
| 9,393,595 B2 * | 7/2016 | Ishii | B24D 11/00 |
| 2003/0008478 A1 | 1/2003 | Abe et al. | |
| 2006/0252355 A1 | 11/2006 | Kumasaka | |
| 2010/0164119 A1 * | 7/2010 | Takesako | H01L 21/02123 |
| | | | 257/774 |
| 2010/0255764 A1 | 10/2010 | Watanabe et al. | |
| 2010/0301431 A1 * | 12/2010 | Ding | B81C 1/00873 |
| | | | 257/417 |
| 2011/0207294 A1 * | 8/2011 | Nakanishi | B24B 9/065 |
| | | | 438/459 |
| 2012/0193752 A1 * | 8/2012 | Purushothaman | H01L 21/76898 |
| | | | 257/506 |
| 2012/0244787 A1 | 9/2012 | Seki et al. | |
| 2012/0252320 A1 * | 10/2012 | Seki | B24B 21/002 |
| | | | 451/28 |
| 2016/0141228 A1 * | 5/2016 | Leobandung | H01L 23/481 |
| | | | 257/621 |

FOREIGN PATENT DOCUMENTS

| | | |
|---|---|---|
| JP | 08-097111 | 4/1996 |
| JP | 08-168946 | 7/1996 |
| JP | 2000-502960 | 3/2000 |
| JP | 2001-345435 | 12/2001 |
| JP | 3534115 | 3/2004 |
| JP | 2006-142388 | 6/2006 |
| JP | 2008-221399 | 9/2008 |
| JP | 2009-125864 A | 6/2009 |
| JP | 2009-241157 | 10/2009 |
| JP | 2010-023119 | 2/2010 |
| JP | 2011-171647 | 9/2011 |
| JP | 2012-179704 A | 9/2012 |
| JP | 2012-213849 | 11/2012 |
| JP | 2014-024128 | 2/2014 |

* cited by examiner

Fig. 9

| SAMPLES | BASE MATERIAL + APPLIED LAYERS | Grain size | PAINT FORMULATION Ratio |
|---|---|---|---|
| EXAMPLE 1 | PI BASE MATERIAL + (two) polyimide layers | 9 μm | 15% DIAMOND + 18% POLYIMIDE |
| EXAMPLE 2 | PI BASE MATERIAL + (TWO) POLYIMIDE LAYERS | 9 μm | 15% DIAMOND + 18% POLYIMIDE |
| COMPARISON EXAMPLE 1 | PET BASE MATERIAL + POLYESTER | 9 μm | 60% DIAMOND + POLYESTER |
| COMPARISON EXAMPLE 2 | PI BASE MATERIAL + (ONE) POLYIMIDE LAYER | 9 μm | 15% DIAMOND + 18% POLYIMIDE |
| COMPARISON EXAMPLE 3 | PI BASE MATERIAL + (ONE) POLYIMIDE LAYER | 9 μm | 15% DIAMOND + 18% POLYIMIDE |

COMPARISON EXAMPLE 1

COMPARISON EXAMPLE 2, 3

Fig. 13

| SAMPLES | BASE MATERIAL + APPLIED LAYERS | ROUGHNESS INDEX VALUES (Ra, Pv) |
|---|---|---|
| EXAMPLE 1 | PI BASE MATERIAL + (TWO) POLYIMIDE LAYERS | Ra: 1.687E+02<br>Pv: 3.493E+03 |
| EXAMPLE 2 | PI BASE MATERIAL + (TWO) POLYIMIDE LAYERS | Ra: 8.653E+01<br>Pv: 9.416E+02 |
| COMPARISON EXAMPLE 1 | PET BASE MATERIAL + POLYESTER | Ra: 7.545E+01<br>Pv: 1.095E+03 |
| COMPARISON EXAMPLE 2 | PI BASE MATERIAL + (ONE) POLYIMIDE LAYER | Ra: 9.908E+01<br>Pv: 9.630E+02 |
| COMPARISON EXAMPLE 3 | PI BASE MATERIAL + (ONE) POLYIMIDE LAYER | Ra: 5.645E+01<br>Pv: 1.022E+03 |

RETREAT POSITION

TAPE-EDGE DETECTING POSITION

POLISHING POSITION

POLISHING METHOD

CROSS REFERENCE TO RELATED APPLICATIONS

This is a continuation-in-part application of U.S. application Ser. No. 13/950,066 filed Jul. 24, 2013, the disclosure of which is hereby incorporated by reference. The present application claims benefit of priorities from Japanese Patent Application Number 2012-164417 filed Jul. 25, 2012 and Japanese Patent Application Number 2014-168363 filed Aug. 21, 2014, the disclosure of which are hereby incorporated by reference.

BACKGROUND

In manufacturing of semiconductor devices, a polishing apparatus for polishing a peripheral portion of a wafer with use of an abrasive film has been widely used. The abrasive film has a structure including a base film made of PET (polyethylene terephthalate) and abrasive grains held by a binder, which is applied to the base film and made of urethane, polyethylene resin, or the like. This abrasive film is a belt-shaped polishing tool and is also called polishing tape.

The conventional abrasive film has a relatively low mechanical strength. As a result, the abrasive film may be damaged when polishing a peripheral portion of a wafer having a hard film of, e.g., SiC, formed on a surface thereof. FIG. 36 is a cross-sectional view showing a wafer having a structure including a silicon substrate and an SiC film formed on the silicon substrate. As shown in FIG. 36, an SiC film (or a silicon carbide film) 310 is formed on an entirety of a surface, including a peripheral portion, of a silicon substrate 301. A device structure constituted by interconnects and a dielectric film may be further formed on the SiC film 310. Since the SiC film 310 is a hard film, the abrasive grains may fall off, or in the worst case, the abrasive film may break when the abrasive film is polishing the peripheral portion of the wafer shown in FIG. 36.

Further, the abrasive film may also be damaged when polishing a peripheral portion of an SOI (Silicon on Insulator) wafer. The SOI wafer is manufactured by bonding a device substrate to a silicon substrate. More specifically, as shown in FIG. 37A and FIG. 37B, a device substrate 302 and a silicon substrate 301 are bonded to each other by an adhesive 313, and a back side of the device substrate 302 is then ground by a grinder. As a result, an SOI wafer having a silicon layer 315 and a device layer 316, which are stacked one on top of another, is obtained as shown in FIG. 37C. Further, as shown in FIG. 37D, the abrasive film is pressed downwardly against the peripheral portion of the SOI wafer to remove peripheral portions of the silicon layer 315, the device layer 316, and the silicon substrate 301, together with the adhesive 313.

The adhesive 313 existing between the device substrate 302 and the silicon substrate 301 forms a hard film. Therefore, when the abrasive film is polishing the peripheral portion of the SOI wafer as shown in FIG. 37D, the abrasive grains may fall off, or in the worst case, the abrasive film may break.

If the abrasive film is damaged during polishing of a wafer as described above, the abrasive film should be replaced with a new one. Frequent replacement of the abrasive film can lower a productivity of the polishing apparatus.

SUMMARY OF THE INVENTION

According to an embodiment, there is provided a method of polishing a peripheral portion of a wafer having a hard film with use of an abrasive film while preventing damage to the abrasive film.

Embodiment, which will be described below, relate to a method of polishing a peripheral portion of a wafer using an abrasive film.

In an embodiment, there is provided a polishing method using an abrasive film including a base film made of polyimide, a binder made of polyimide, and abrasive grains held by the binder, comprising: rotating a silicon substrate having a surface on which a silicon carbide film is formed; and removing the silicon carbide film from a peripheral portion of the silicon substrate by pressing the abrasive film at a low force against the silicon carbide film on the peripheral portion of the silicon substrate.

In an embodiment, said pressing the abrasive film is performed while causing a surface of the binder to exhibit a water repellency by a contact between the silicon carbide film and the binder.

In an embodiment, the polishing method further comprises finish-polishing the peripheral portion of the silicon substrate by pressing a finishing abrasive film against the peripheral portion of the silicon substrate after said removing the silicon carbide film.

In an embodiment, there is provided a polishing method using an abrasive film including a base film made of polyimide, a binder made of polyimide, and abrasive grains held by the binder, comprising: rotating an SOI wafer having two substrates which are bonded together by an adhesive; and removing the adhesive from a peripheral portion of the SOI wafer by pressing the abrasive film at a low force against the peripheral portion of the SOI wafer.

In an embodiment, the polishing method further comprises: finish-polishing the peripheral portion of the SOI wafer by pressing a finishing abrasive film against the peripheral portion of the SOI wafer after said removing the adhesive.

According to the above-described embodiments, the abrasive film having a high mechanical strength is used. Moreover, the abrasive film is pressed against a peripheral portion of a wafer at a low force (e.g., a force in a range of 3 N to 10 N). Therefore, a hard film, such as an SiC film or a solidified adhesive, formed on the peripheral portion of the wafer can be removed by the abrasive film without being damaged by such a hard film.

BRIEF DESCRIPTION OF THE DRAWINGS

FIG. 9 is a chart showing a summary of samples prepared for polishing tests;

FIG. 13 is a chart showing the results of the polishing tests (on index values of surface roughness);

DESCRIPTION OF EMBODIMENTS

Embodiments will be described below with reference to the drawings. A polishing apparatus according to an embodiment is configured to polish a peripheral portion of a wafer by bringing a polishing surface of an abrasive film into contact with the peripheral portion of the wafer. In this specification, a peripheral portion of a wafer is defined as a region including a bevel portion, which is an outermost portion of the wafer, and edge portions located radially inwardly of the bevel portion.

Figure 1A:
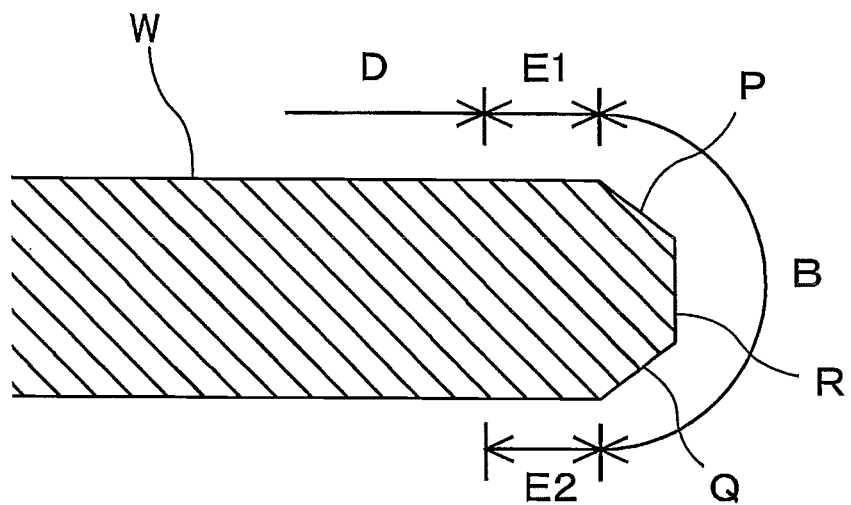
FIG. 1A and FIG. 1B are enlarged cross-sectional views each showing a peripheral portion of a wafer.
Figure 1B:
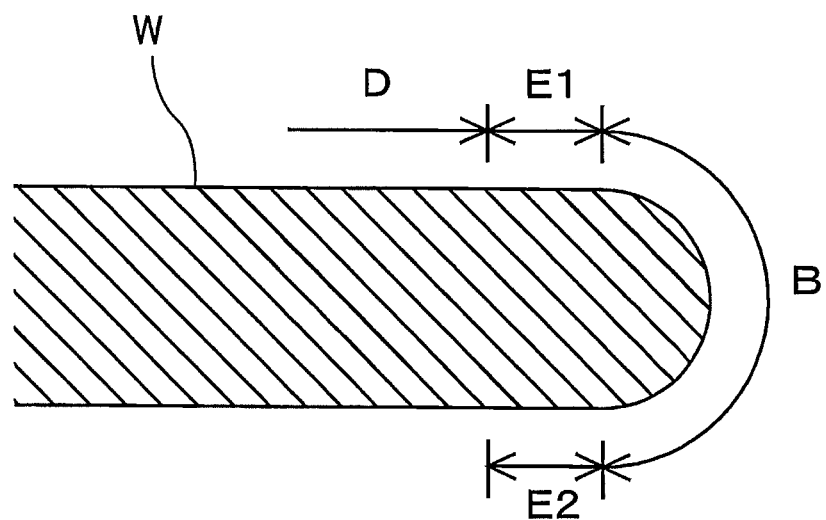

FIG. 1A and FIG. 1B are enlarged cross-sectional views each showing the peripheral portion of the wafer. More specifically, FIG. 1A shows a cross-sectional view of a so-called straight-type wafer, and FIG. 1B shows a cross-sectional view of a so-called round-type wafer. In the wafer W shown in FIG. 1A, the bevel portion is an outermost circumferential surface of the wafer W (indicated by a symbol B) that is constituted by an upper slope (an upper bevel portion) P, a lower slope (a lower bevel portion) Q, and a side portion (an apex) R. In the wafer W shown in FIG. 1B, the bevel portion is a portion (indicated by a symbol B) having a curved cross section and forming an outermost circumferential surface of the wafer W. Edge portions E1, E2 are regions located inwardly of the bevel portion B. The upper edge portion E1 is a flat portion located inwardly of the bevel portion B and located outwardly of a region D where devices are formed. The lower edge portion E2 is a flat portion located opposite to the upper edge portion E1 and lies in a back surface of the wafer W. In the following descriptions, the upper edge portion E1 and the lower edge portion E2 may be collectively referred to as edge portion E.

Figure 2:
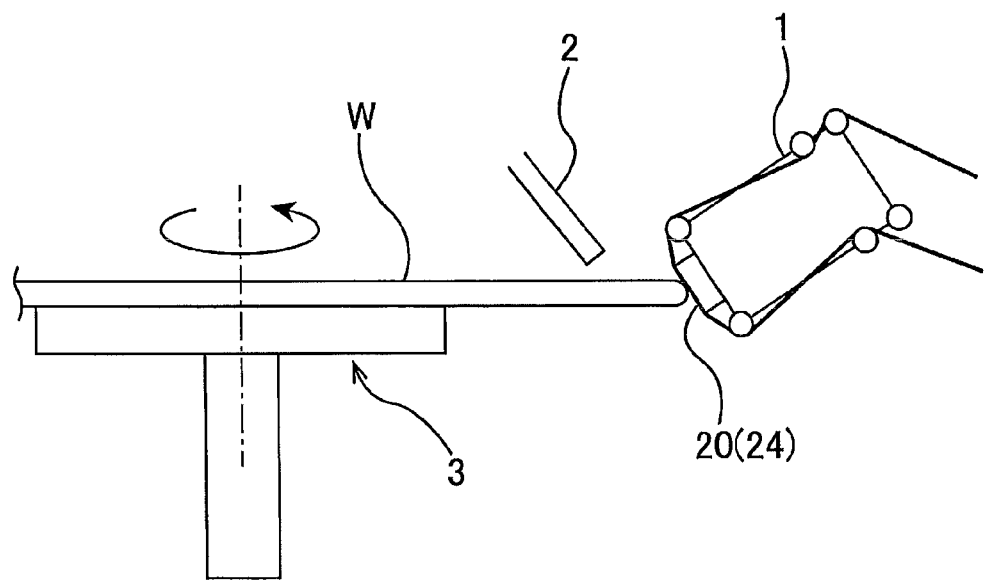
FIG. 2 is a schematic view showing a polishing apparatus capable of performing a polishing method according to an embodiment.

FIG. 2 is a schematic view showing a polishing apparatus capable of performing a polishing method according to an embodiment of the present invention. The polishing apparatus includes a wafer holder 3 configured to hold a wafer W and rotate the wafer W about its axis, a polishing head 1 configured to press an abrasive film 20 against a peripheral portion of the wafer W, held on the wafer holder 3, to polish the peripheral portion of the wafer W, and a polishing-liquid supply nozzle 2 configured to supply a polishing liquid onto a surface (or an upper surface) of the wafer W held on the wafer holder 3. Examples of the polishing liquid to be used include pure water.

The wafer W, to be polished by the polishing method according to the embodiment, is a wafer having a silicon substrate and a hard film formed on the silicon substrate. The hard film may be a silicon carbide film (or SiC film) 310 shown in FIG. 29 or may be a solidified adhesive 313 shown in FIG. 30.

The wafer W is polished as follows. The wafer W is placed onto the wafer holder 3 by a transfer robot, not shown in the figures. The wafer holder 3 holds a lower surface of the wafer W by a known technique, such as vacuum suction. Further, the wafer holder 3 rotates the wafer W about its axis. The polishing-liquid supply nozzle 2 supplies the polishing liquid (e.g., pure water) onto the upper surface (including the peripheral portion) of the rotating wafer W, while the polishing head 1 presses a polishing surface of the abrasive film 20 against the peripheral portion (i.e., the edge portion and the bevel portion) of the wafer W to thereby remove the hard film (e.g., the SiC film or the adhesive) from the peripheral portion of the wafer W.

After the removal of the hard film (e.g., the SiC film or the adhesive) from the peripheral portion of the wafer W, the abrasive film 20 may be replaced with a finishing abrasive film 24, which is set on the polishing head 1, so that finish-polishing of the peripheral portion of the wafer W may be performed by pressing the finishing abrasive film 24 against the peripheral portion of the wafer W. The finishing abrasive film 24 has finer abrasive grains than those of the abrasive film 20. The finishing abrasive film 24 includes a base film comprising a polyimide tape or a PET tape. Performing the finish-polishing can smoothen a polished surface of the wafer and as a result, dust or particles are less likely to adhere to the wafer W.

The abrasive film 20 includes abrasive grains held by polyimide which constitutes a binder. Accordingly, the polishing surface of the abrasive film 20 is constituted by the abrasive grains and polyimide. When the abrasive film 20 is polishing the SiC film on the silicon substrate, polyimide, which constitutes the binder, is placed in contact with the SiC film. As a result, polyimide exhibits a water repellency (or hydrophobic property). Therefore, during polishing of the wafer W, the polishing surface of the abrasive film 20, while exhibiting the water repellency, polishes the peripheral portion of the wafer W.

A force of the abrasive film 20 applied to the peripheral portion of the wafer W during polishing of the wafer W is preferably in a range of 3 N to 10 N. The reason of this is that, if the peripheral portion of the wafer W is polished at less than 3 N, a polishing rate (or a removal rate) is lowered, while if the peripheral portion of the wafer W is polished at more than 10 N, the abrasive film may be damaged as described above. Generally, a force of an abrasive film to be applied to a wafer is about 12 N. In contrast, in the embodiment, the force of the abrasive film 20 applied to the peripheral portion of the wafer W is in the range of 3 N to 10 N, which is smaller than the force that is typically used. The use of such a low load in polishing of the wafer W can reduce a stress on the wafer W and can also reduce damage to the abrasive film 20. As a result, a life of the abrasive film 20 can increase and an amount of the abrasive film 20 to be used can decrease.

Figure 3:
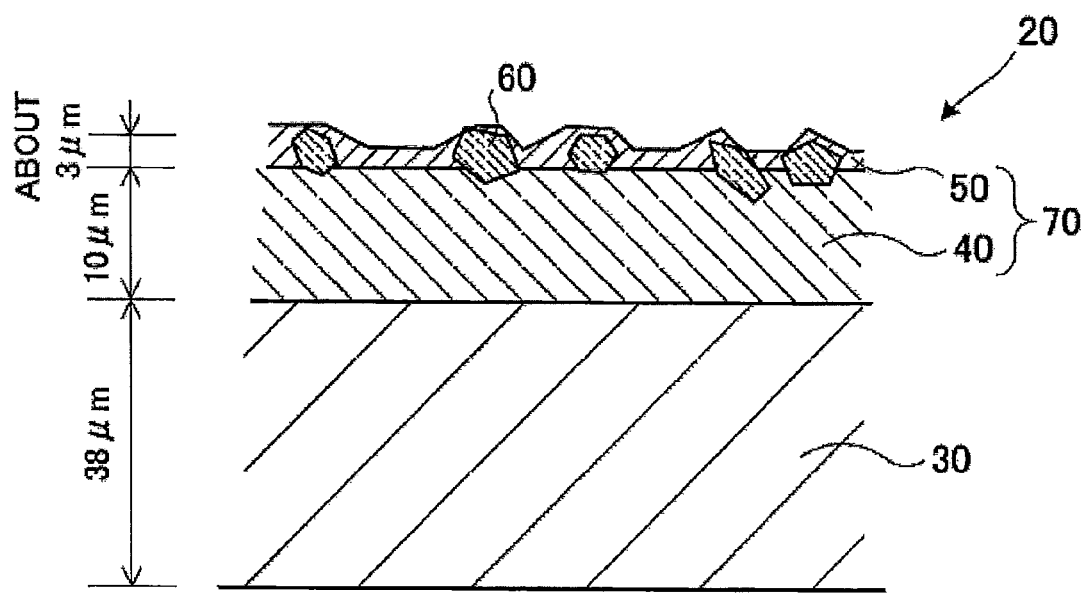
FIG. 3 shows a sectional configuration showing a detailed structure of an abrasive film shown in FIG. 2.

FIG. 3 shows a sectional configuration of the abrasive film 20. The abrasive film is also called polishing tape. The abrasive film 20 includes a base film 30, a first layer 40, and a second layer 50. The first layer 40 is formed on one surface of the base film 30. The second layer 50 is formed on the first layer 40. The second layer 50 includes abrasive grains 60. Most of the abrasive grains 60 are situated in an interior of the second layer 50. A part of the abrasive grains 60, more specifically, that of the abrasive grains 60 whose grain sizes are relatively large sink into the first layer 40. Surfaces of the abrasive grains 60 may be covered completely by the second layer 50 or may be exposed partially from a surface of the second layer 50.

The base film 30 not only imparts a required strength to the abrasive film 20 but also increases the handling properties of the abrasive film 20. In this embodiment, the base film 30 is formed from polyimide. Using polyimide can enhance the strength of the abrasive film 20 higher than that of a conventional abrasive film using a base film formed from PET and the like.

In this embodiment, the thickness of the base film 30 is 38 µm. In another embodiment, the thickness of the base film 30 is 10 µm or larger. Using such base film 30 makes it difficult for wrinkles or rupture to be generated in the base film 30, and increases the handling properties of the abrasive film 20 fabricated, when fabricating the abrasive film 20. In another embodiment, the thickness of the base film 30 is 50 µm or smaller. Using such base film 30 enables the abrasive film 20 to follow preferably a non-flat shape (for example, an edge or a curved surface) of an object to be polished when polishing the object by the use of the abrasive film 20. Namely, applications of the abrasive film 20 can be expanded. In particular, the abrasive film 20 can easily bend along the shape of the peripheral portion of the wafer when polishing the wafer.

Each of the first layer 40 and the second layer 50 serves as a binder that holds the abrasive grains 60. The first layer 40 also functions as an underlying layer for the second layer 50. In this embodiment, the first layer 40 and the second layer 50 are formed from polyimide. In another embodiment, the first layer 40 is formed from polyimide, and the second layer 50 is formed from polyimide and a filler. The filler enhances the affinity between polyimide and the abrasive grains 60. For example, silica grains can be used as the filler. Additionally, using the same material as that of the base film 30 for the first layer 40 can enhance the adhesion of the first layer 40 to the base film 30.

In this embodiment, the thickness of the first layer 40 is 10 µm. The thickness of the second layer 50 is about 3 µm. In another embodiment, the thickness of the second layer 50 is ⅕ of the average grain size of the abrasive grains 60 or larger. Using such second layer 50 can obtain a preferable level of holding strength of the abrasive grains 60. In another embodiment, the thickness of the second layer 50 is ½ the average grain size of the abrasive grains 60 or smaller. Using such second layer 50 prevents the abrasive grains 60 from being covered excessively by the second layer 50. As a result, the abrasive grains 60 are allowed to function as cutting blades in a preferable fashion.

The abrasive grains 60 are grains of an abrading or polishing material, and in polishing, portions of the abrasive grains 60 which are situated at a front surface side of the second layer 50 operate as cutting blades. For example, diamond grains, silicon carbide (SiC), alumina ($Al_2O_3$), silica ($SiO_2$), and manganese oxide ($MnO_2$) can be used for the abrasive grains 60. In this embodiment, industrial diamond (polycrystalline diamond) is used for the abrasive grains 60. In this embodiment, the average grain size of the abrasive grains 60 is 9 µm. However, the average grain size of the abrasive grains 60 can be set in the range from about 0.1 µm to about 20 µm as required.

In this application, the grain size of the abrasive grains 60 is measured by the use of a laser diffraction method (also referred to as Microtrac method). As a measuring device, a Microtrac X100 (commercially available from NIKKISO Co., Ltd) is used. When used herein, the "average grain size" means a grain size (D50) at 50% of an integrated value in a grain size distribution which is obtained by the laser diffraction method.

In the abrasive film 20 described above, a division between the first layer 40 and the second layer 50 is a conceptual division based on a fabrication method of the abrasive film 20, which will be described below, and hence, it does not always happen that the first layer 40 and the second layer 50 can be identified as separate layers based on the division after the abrasive film 20 is fabricated. For example, in the case of the first layer 40 and the second layer 50 being formed from the same material, a boundary between the first layer 40 and the second layer 50 cannot be identified in reality. Because of this, the first layer 40 and the second layer 50 can also be regarded as a single surface layer 70.

As shown in FIG. 3, in the abrasive film 20, all of the abrasive grains are situated in a half portion of the surface layer 70 in a direction of a thickness of the surface layer 70 (whose thickness is about 13 µm) which lies opposite to the base film 30, that is, within a front surface side half portion of the surface layer 70. The abrasive grains 60 are held near the front surface of the surface layer 70. Namely, there is no such situation in which a plurality of abrasive grains 60 are stacked in a direction of a thickness of the base film 30. Because of this, each of the abrasive grains 60 is held in such a state that all or almost all of the surfaces of the abrasive grains 60 are in contact with the surface layer 70 which serves as the binder. Since the abrasive grains 60 are firmly held by the surface layer 70 serving as the binder, the abrasive film 20 can polish the above-described hard film. Moreover, since the surface layer 70 is formed mainly from polyimide, the holding strength of the abrasive grains 60 is further enhanced, compared with an abrasive film in which polyester or the like is used.

Additionally, since the abrasive grains 60 are not stacked in the direction of the thickness of the abrasive film 20, the amount of abrasive grains 60 to be used can be reduced. As a result, with the abrasive film 20, the reduction in production cost and saving of resources are realized. Further, respective projecting heights of the abrasive grains 60 do not vary largely. Because of this, in polishing an object to be polished, projections of the abrasive grains 60 come to contact the object to be polished almost uniformly, and therefore, the occurrence of uneven polishing and generation of scratches can be suppressed. In addition, no abrasive grain 60 exists on contact surfaces of the base film 30 and the first layer 40, and therefore, a high adhesion can be realized between the base film 30 and the first layer 40. These characteristics of the abrasive film 20 are realized by a fabrication method of the abrasive film 20, which will be described later.

In addition, in the abrasive film 20, since a polyimide, which has high strength, is used as the material of the base film 30, the tensile strength and rupture strength of the substrate itself are high. Because of this, compared with conventional abrasive films in which PET, PEN, PP, PE are broadly used as a base material, the abrasive film 20 can suppress the occurrence of a problem inherent in the conventional abrasive films that an abrasive tape is stretched during the process or the process is not stable. These problems tend to easily occur in the event that the width of the abrasive film is narrow, for example, 10 mm or less.

Figure 4:
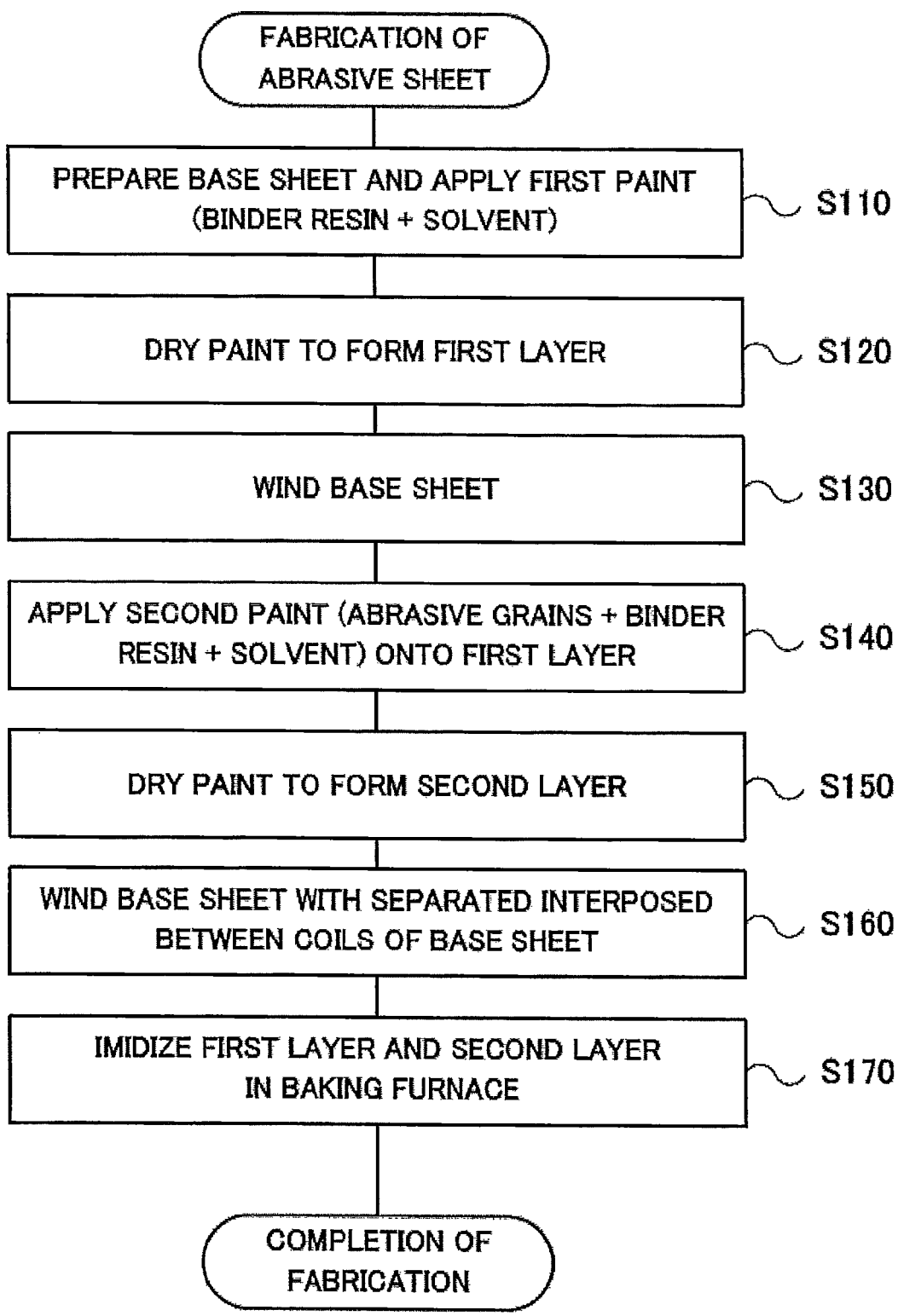
FIG. 4 is a flowchart showing a fabrication process of the abrasive film described above.
Figure 5:
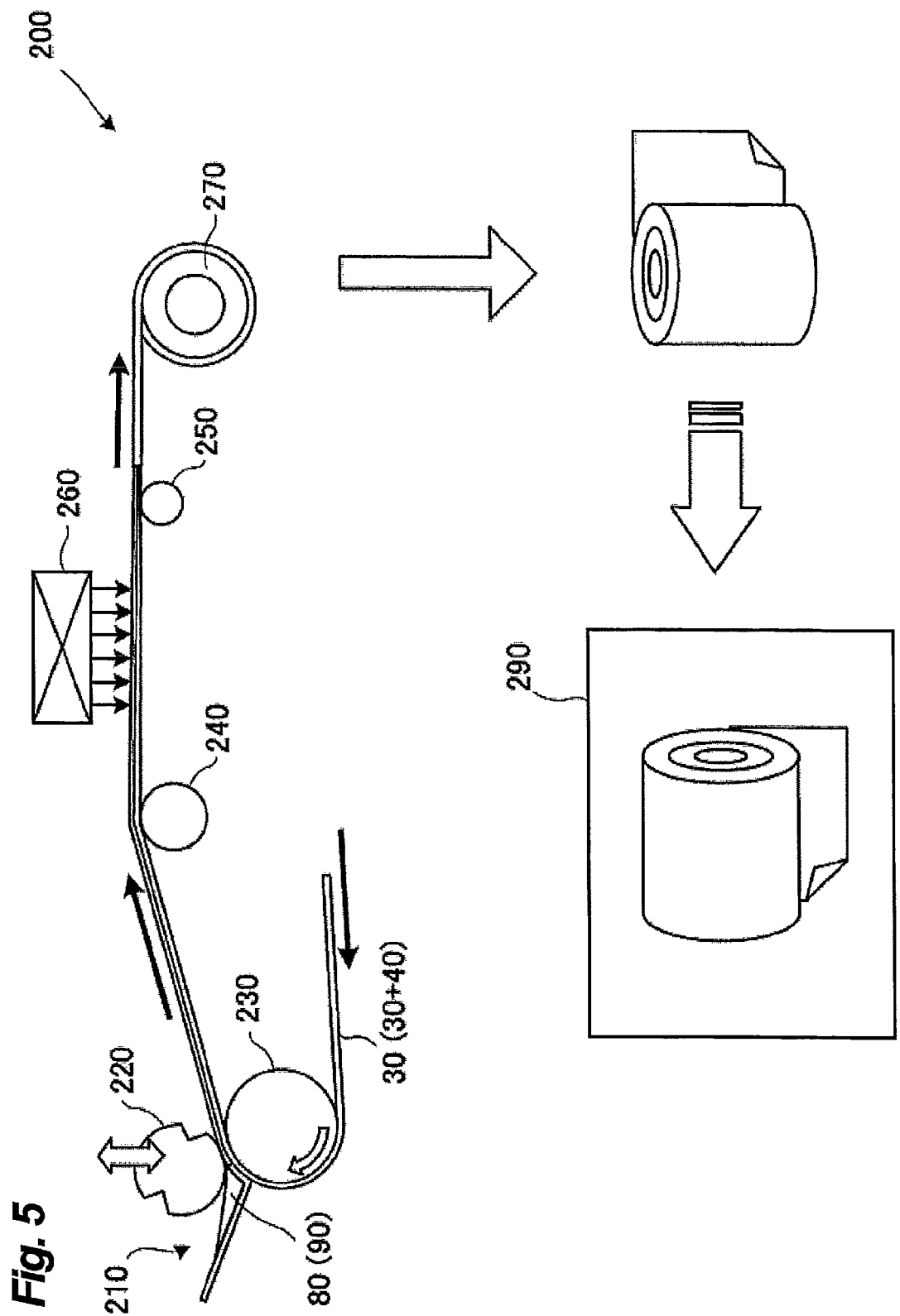
FIG. 5 is a diagram schematically showing the configuration of a fabrication system for the abrasive film.

FIG. 4 is a flowchart showing a fabrication process of the abrasive film 20 that has been described above. FIG. 5 shows schematically the configuration of a fabrication system 200 for the abrasive film 20. As shown in FIG. 4, in fabrication of the abrasive film 20, firstly, the base film 30 is prepared, and one surface of the base film 30 is coated with a first paint 80 (step S110).

In this embodiment, POMIRAN N38 (commercially available from ARAKAWA CHEMICAL INDUSTRIES, LTD.), which is one kind of polyimide, is used for the base film 30. In one embodiment, a film that is fully imidized in advance is used for the base film 30. Using the film so imidized means that the base film 30 whose strength is high is handled, and therefore, the handling properties of the base film 30 are enhanced. Whether or not the base film 30 is fully imidized can be determined by imidizing the base film 30 again and comparing weights of the base film 30 before and after the re-imidization thereof. For example, an area of 5 cm² is cut out from the base film 30 as a sample, and the sample is heated at 300° C. for one hour to thereby be imidized. As a result, in a case the sample is such that an imidization ratio, which is calculated from a change in weight and an amount of by-product water produced in the process of imidization, is equal to or larger than 70%, it can be said that the sample is fully imidized.

The first paint 80 contains a solvent and a binder resin. A resin solid content of the binder resin constitutes finally a constituent of the first layer 40. Although the binder resin remains highly viscous as it is, by adding the solvent to the binder resin, the viscosity of the first paint 80 is adjusted to a viscosity which is appropriate for application of the first paint 80. In this embodiment, POLYIMIDE-SILICA HYBRID VARNISH HBI-58 (commercially available from ARAKAWA CHEMICAL INDUSTRIES, LTD.) is used for the binder resin. For the solvent, for example, an alkylamide solvent is used. The alkylamide solvent has a high polarity, and therefore, whether it is organic or inorganic, a solute can preferably be dispersed in the alkylamide solvent. In this embodiment, DMAc (dimethylacetamide) is used for the alkylamide solvent. However, DMF (dimethylformamide) or the like may be used for the alkylamide solvent.

In this embodiment, the first paint 80 is prepared by solving 50 g of DMAc for 200 g of the binder resin, stirring the mixture, and degassing and deaerating it in a vacuum chamber. A ratio of a resin solid content in the binder resin to the whole of the first paint 80 is 20 wt %. In this embodiment, the viscosity of the provided binder resin is in the range from 25000 to 30000 mPa·s/25° C., and the viscosity of the first paint 80 is adjusted to 10000 to 20000 mPa·s/25° C. by adding the solvent.

The prepared first paint 80 is applied to one surface of the base film 30. In this embodiment, the first paint 80 is applied to the base film 30 by the use of a comma coating method. Specifically, as shown in FIG. 5, firstly, the base film 30 which is wound into a roll (here, a roll of base film 30 which is 300 mm wide and about 20 m long) is set in the fabrication system 200 (not shown in the figure), and the base film 30 is unwound to be fed out sequentially between a comma roll 220 and a coating roll 230. By doing so, the first paint 80 stored in a coater dam 210 is applied to the base film 30. A feed-out speed (a coating speed) of the base film 30 can be, for example, 0.5 m/min.

A coating thickness can be controlled by adjusting a gap between the comma roll 220 and the base film 30. In one embodiment, the coating thickness of the first paint 80 is equal to or larger than the average grain size of the abrasive grains 60 after the first paint 80 is dried in step S120, which will be described later. By doing so, it is possible to obtain a preferable thickness of the first layer 40 for grains which have larger grain diameters among the abrasive grains 60 to sink into the first layer 40 towards the base film 30. In another embodiment, the coating thickness of the first paint 80 is not more than three times the average grain size of the abrasive grains 60 after the first paint 80 is dried in step S120, which will be described later. By doing so, the first layer 40 is not unnecessarily formed to have an excessive thickness.

As shown in FIG. 4, after the first paint 80 is applied to the base film 30, the first paint 80 is then dried to thereby form the first layer 40 (step S120). In this embodiment, the first paint 80 is dried by heating the first paint 80 at 130° C. for two minutes. Specifically, as shown in FIG. 5, the base film 30 to which the first paint 80 is applied is carried on rollers 240, 250 while the first paint 80 is dried sequentially by a warm-air drier 260 which is provided above a carrying line of the base film 30. A heating range of the warm-air drier 260, for example, spreads over an area of 1.0 m long in a feeding direction of the base film 30.

After the first paint 80 is dried, as shown in FIG. 4, the base film 30 on which the first layer 40 is formed is wound into a roll (step S130). As shown in FIG. 5, the base film 30 is wound around a hollow cylindrical core 270.

After the base film 30 is wound fully around the core 270, as shown in FIG. 4, the wound base film 30 is sequentially unwound to be fed out, and a second paint 90 is applied onto the first layer 40 (step S140). The application of the second paint 90 in step S140 is performed in a similar way to the way in which the first paint 80 is applied in the step S110 by the use of the fabrication system 200 (refer to FIG. 5). Although the facility for applying the first paint 80 is provided separately from the facility for applying the second paint 90, those paint application facilities in FIG. 5 are shown as the paint application facility common for both the first paint 80 and the second paint 90 for the sake of simplifying the illustration.

The second paint 90 contains a solvent, the abrasive grains 60, and a binder resin. A resin solid content of this binder resin constitutes finally a constituent of the second layer 50. In this embodiment, the binder resin used for the second paint 90 is of the same kind as the binder resin used for the first paint 80. In this embodiment, the solvent and the binder resin used for the second paint 90 are of the same kind as the solvent and the binder resin used for the first paint 80. In addition, the second paint 90 is prepared in a similar way to the way in which the first paint 80 is done. Namely, the viscosity of the second paint 90 is adjusted by adding the solvent to the binder resin. Then, the resulting mixture is stirred and is thereafter degassed and deaerated in a vacuum chamber. In this embodiment, a ratio of abrasive grains 60 in the second paint 90 to a resin solid content in the second paint 90 is 15 wt %. In addition, a ratio of the resin solid content of the binder resin to the whole of the second paint 90 is 18 wt %.

In one embodiment, the viscosities of the first paint 80 and the second paint 90 are 10000 mPa·s/25° C. or larger and 30000 mPa·s/25° C. or smaller. When the viscosities of the first and second paints 80, 90 are adjusted to viscosities falling in such a range, preferable dispersions of the respective constituents of the first paint 80 and the second paint 90 can be obtained. In one embodiment, a ratio of the abrasive grains contained in the second paint 90 to the resin solid content in the second paint 90 is 5 wt % or larger and 30 wt % or smaller. In one embodiment, a ratio of the resin solid content to the whole of the second paint 90 is 10 wt % or larger and 50 wt % or smaller. By doing so, it is possible to obtain a preferable film thickness for the second layer 50, a preferable holding strength for holding the abrasive grains 60, and a preferable dispersion of the binder resin and the abrasive grains 60 in the second paint 90. In addition, compared with a conventional abrasive film, the amount of abrasive grains 60 to be used can be reduced largely.

After the second paint 90 is applied to the base film 30, the second paint 90 is dried to thereby form the second layer 50 (step S150). The drying operation in step S150 is performed in a similar way to the way adopted in step S120 described above by the use of the fabrication system 200 (refer to FIG. 5).

Figure 6:
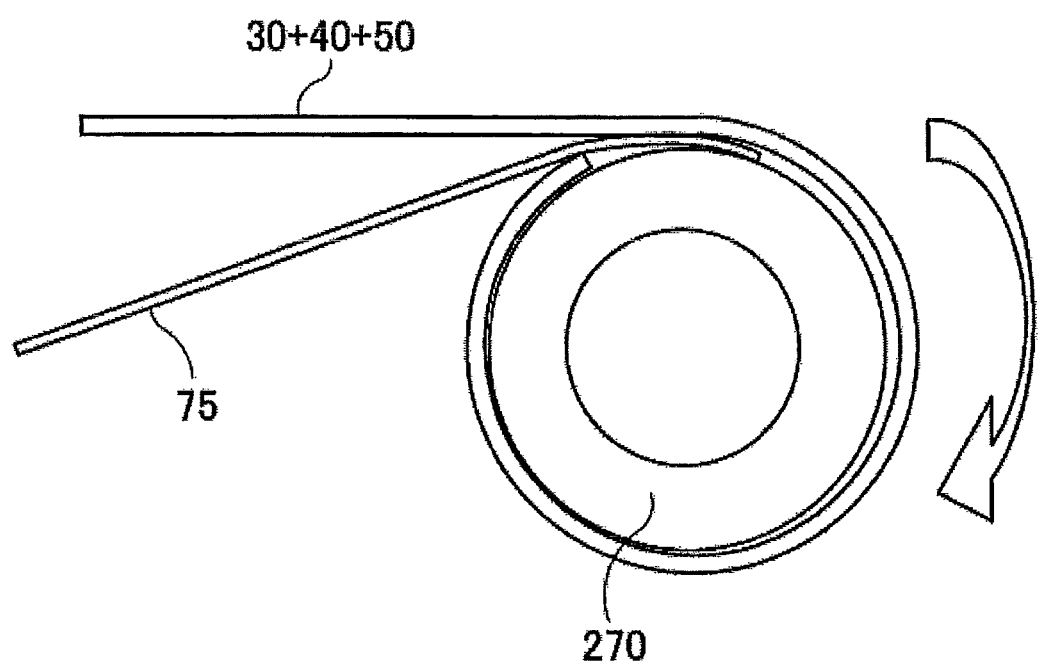
FIG. 6 is an explanatory diagram showing how to wind an abrasive film being fabricated.

After the second paint 90 is dried, the base film 30 on which the first layer 40 and the second layer 50 are formed is then wound into a roll (step S160). The winding of the base film 30 in step S160 is performed in a similar way to the way in which the base film 30 is wound in step S130 described above by the use of the fabrication system 200 (refer to FIG. 5). However, in step S160, as shown in FIG. 6, the base film 30 on which the first layer 40 and the second layer 50 are formed is wound with a separator sheet 75 disposed on the second layer 50. In other words, the base film 30 is wound with the separator sheet 75 sandwiched between coils of the base film 30 which lie adjacent to each other in a radial direction.

Various kinds of materials can be used for the separator sheet 75 whose properties are not changed in temperature conditions of an imidization step (step S170), which will be described later. For example, a non-woven fabric made of polyimide fibers which are fully imidized or a surface-textured polyimide film can be used for the separator sheet 75. In one embodiment, a sheet having permeability like a non-woven fabric is used for the separator sheet 75, so that gas or water content produced during imidization is easily passed out through the separator sheet 75.

After the base film 30 on which the first layer 40 and the second layer 50 are formed is wound, finally, as shown in FIG. 4, the base film 30 is set in an interior of a vacuum baking furnace so that the first layer 40 and the second layer 50 are imidized (step S170). In this embodiment, the interior of the baking furnace is sealed up and vacuumed. Thereafter, the temperature in the interior of the baking furnace is increased gradually, and the base film 30 is held in the baking furnace under temperature condition of 250 to 300° C. for one to two hours. Then, nitrogen gas or dried air is supplied into the interior of the vacuum baking furnace so as to cool down the interior thereof naturally under normal pressures. By adopting the process described, the imidization (curing reaction) of polyimide resin can be completed more quickly than the imidization carried out under normal temperature and pressure conditions. The processing conditions in step S170 may be set as required. In one embodiment, the processing conditions in step S170 are such that heating is carried out in the temperature range from 200° C. or higher to 350° C. or lower for one hour or longer and four hours or shorter. By heating the base film 30 under these conditions, it is possible to obtain an effective curing reaction.

In step S170, imidization (thermal curing reaction) starts from the second layer 50 and the peripheries of the abrasive grains 60, whose heat conductivity is high. Then, with the abrasive grains 60 forced to the first layer 40 side by a film of the second layer 50 which is cured earlier, the whole of the first layer 40 is imidized (cured) gradually, whereby the surface layer 70 (made up of the first layer 40 and the second layer 50) is formed near the surface of the second layer 50 so that the abrasive grains 60 are substantially aligned with each other in terms of projecting height.

In step S170, the wound base film 30 is set within the interior of the baking furnace 290 with a winding shaft oriented in a horizontal direction as shown in FIG. 5. By performing the imidization in such a state, the wound base film 30 is thermally expanded, thereby making it possible to suppress the occurrence of loose or shift of the roll. When the imidization is performed in this way, the abrasive film 20 is completed.

Figure 7:
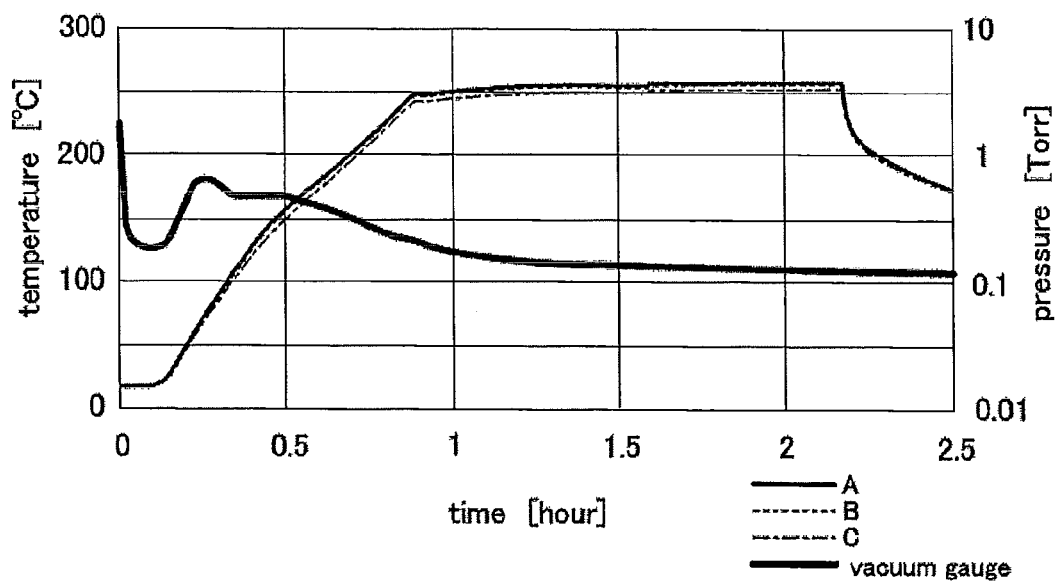
FIG. 7 is an explanatory diagram showing an example of a heating condition in an imidization process.
Figure 8:
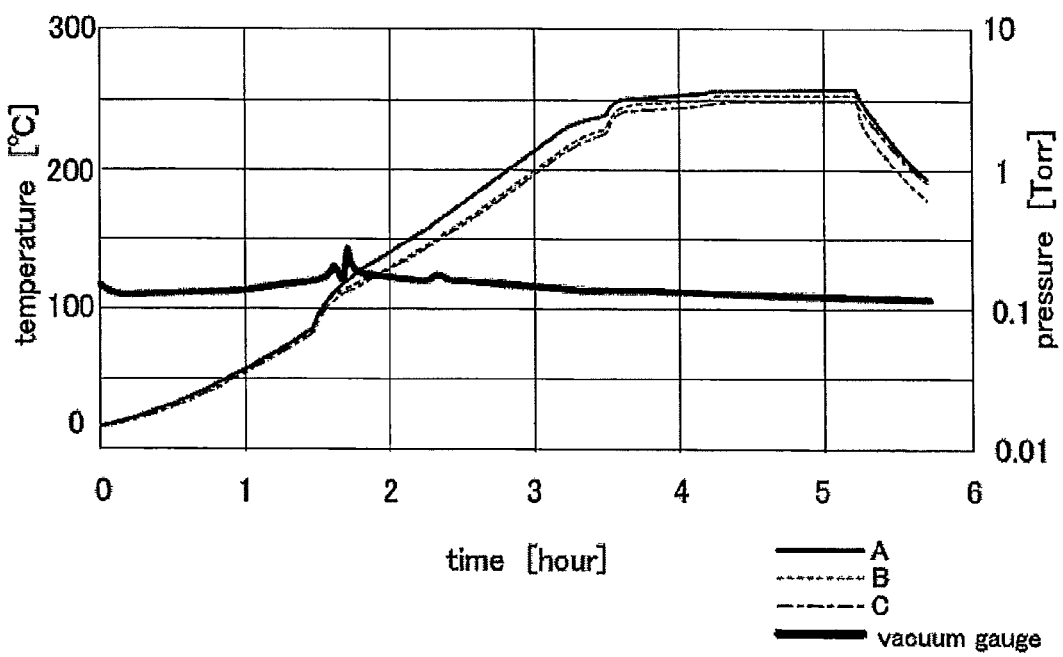
FIG. 8 is an explanatory diagram showing an example of a heating condition in the imidization process.

FIGS. 7 and 8 show one example of heating conditions in the imidization step (step S170). FIG. 7 shows a heating condition in which on the order of one hour is spent increasing the heating temperature to 250° C., and thereafter, the wound base film 30 is heated for about one hour. FIG. 8 shows a heating condition in which on the order of four hours is spent increasing the heating temperature to 250° C., and thereafter, the wound base film 30 is heated for about one hour. When the imidization is executed under the condition shown in FIG. 7, neither wrinkle nor tacking is produced in the base film 30 which is a target for imidization. When the imidization is executed under the condition shown in FIG. 8, wrinkles and/or tacking is produced in the base film 30 which is the imidization target for imidization. From these facts, according to one embodiment, the temperature increasing time to increase the heating temperature in the imidization step can be one hour or shorter.

According to the fabrication method of the abrasive film 20, the abrasive film 20 described above can be fabricated preferably. In addition, since the base film 30 on which the first layer 40 and the second layer 50 are formed is imidized in such a state that the base film 30 is wound into the roll, the facility for imidization can be made much smaller in size. For example, according to the method of this embodiment, the abrasive film 20 can be imidized within an installation space of several meters long. On the other hand, in the event that the base film 30 on which the first layer 40 and the second layer 50 are formed is heated for one hour in such a state that the base film 30 extends long flat by the use of a continuous annealing furnace while the base film 30 is being carried by a conveyor belt, and thereafter is cooled down, with a carrying speed of 0.5 m/min, a space of 60 m long is necessary to install the facility for increasing the heating temperature and for heating the base film 30, and a space of 30 m long is necessary to install the facility for cooling down the base film 30.

Moreover, according to the fabrication method of the abrasive film 20, since a large quantity of base film 30 can be processed at one time, the fabrication time of the abrasive film 20 per unit quantity can be reduced. Further, since the separator sheet 75 is sandwiched between the coils of the base film 30 on which the first layer 40 and the second layer 50 are formed, in imidizing the base film 30, the second layer 50 of the base film 30 and a rear surface (an opposite surface to the first layer 40 and the second layer 50) of the base film 30 that is disposed on the second layer 50 can be restrained from sticking to each other. Additionally, since the necessity of separating the coils of the base film 30 which stick to each other can be obviated, the fall of the abrasive grains 60 from the second layer 50 can also be restrained which would otherwise occur in association with the separation of the second layer 50 on the base film 30 from the rear surface of the base film 30.

A-3. Evaluation Tests

Some abrasive film samples were fabricated to evaluate the abrasive film 20 that has been described heretofore. FIG. 9 shows a summary of the samples fabricated. Samples of Examples 1, 2 are abrasive films 20 which were fabricated by the use of the fabrication method shown in FIG. 4, and have the sectional configuration shown in FIG. 3. The average grain size of abrasive grains 60 is 9 μm. A ratio of the abrasive grains 60 contained in the second paint 90 to a resin solid content in the second paint 90 is 15 wt %, and a ratio of the resin solid content of a binder resin (polyimide) to the whole of the second paint 90 is 18 wt %.

A sample of Comparison Example 1 is a conventional abrasive film. To fabricate Comparison Example 1, PET was used for a base film, and polyester was used as a binder resin. The abrasive film of Comparison Example 1 was fabricated by applying a paint containing a binder resin, abrasive grains, and a solvent to a base material and drying it. A ratio of the abrasive grains to the whole of the paint is 60 wt %. Comparison Examples 2, 3 differ from Examples 1, 2 in that they were fabricated by the use of the fabrication method shown in FIG. 4 in which forming the first layer 40 is omitted and are the same as Examples 1, 2 with respect to the other features.

Two types of abrasive grains having different grain shapes were used for these samples. Specifically, abrasive grains of a blocky type were used for the samples of Example 1, Comparison Example 1 and Comparison Example 2. Abrasive grains of an irregular type were used for the samples of Example 2 and Comparison Example 3. The grain size distribution of the blocky type abrasive grains is such that D10 is 5.12 μm, D50 is 6.84 μm, D90 is 9.76 μm, and D95 is 11.20 μm. The grain size distribution of the irregular type abrasive grains is such that D10 is 6.18 μm, D50 is 8.14 μm, D90 is 11.36 μm, and D95 is 12.86 μm. A largest grain size of the abrasive grains is 22.00 μm for each type. The grains size distribution of the irregular type abrasive grains is sharp, while the grains size distribution of the blocky type abrasive grains is broad.

Figure 10A:
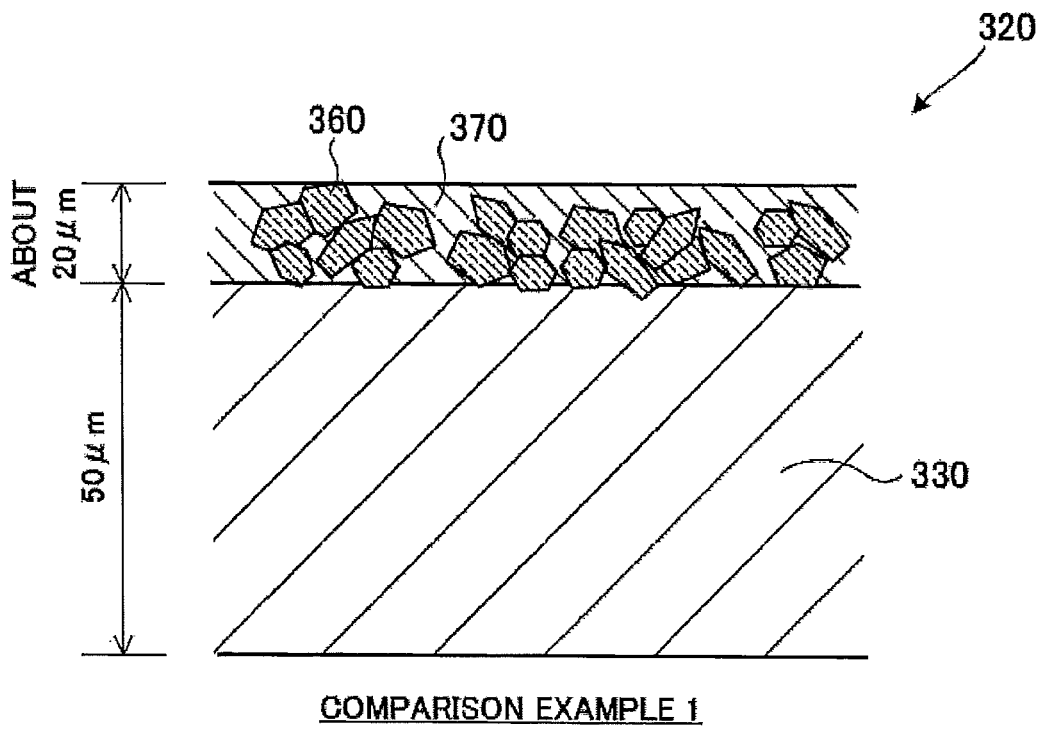
FIG. 10A and FIG. 10B show explanatory diagrams showing sectional configurations of abrasive films prepared as comparison examples.

FIG. 10 shows sectional configuration of Comparison Examples 1 to 3 fabricated. As shown in FIG. 10A, an abrasive film 320 of Comparison Example 1 includes a base film 330 and a surface layer 370. The thickness of the base film 330 is about 50 μm, and the thickness of the surface layer 370 is about 20 μm. Abrasive grains 360 are stacked in a direction of a thickness and held in place in such a state. Since the abrasive grains 360 aggregate, an area of each abrasive grain 360 where the abrasive grain 360 is in contact with a resin material in the surface layer 370 is smaller than that of the abrasive grain 60 in the abrasive film 20 (refer to FIG. 3). Because of this, compared with the abrasive film 20, the holding force of the abrasive grains 360 is reduced. In addition, the existence of the abrasive grains 360 on a boundary between the base film 330 and the surface layer 370 reduces the bonding strength of the base film 330 and the surface layer 370, compared with the abrasive film 20. Additionally, most of the abrasive grains 360 are situated on a base film 330 side of the surface layer 370, which does not contribute to a polishing operation.

Figure 10B:
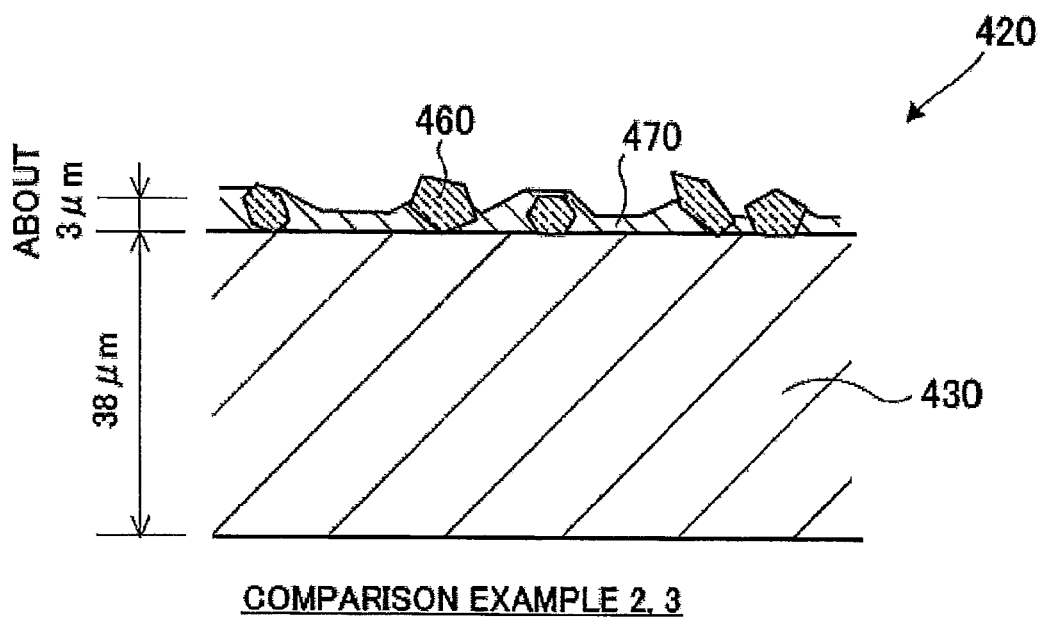
Figure 11A:
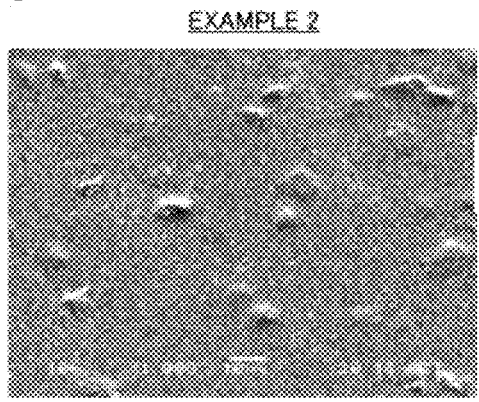
FIG. 11A, FIG. 11B, FIG. 11C, FIG. 11D, and FIG. 11E show the results of observation of the abrasive films.
Figure 11B:
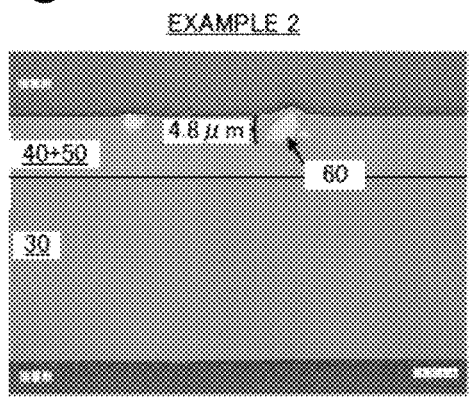
Figure 11C:
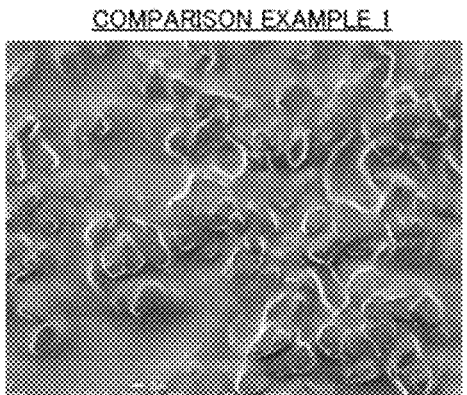
Figure 11D:
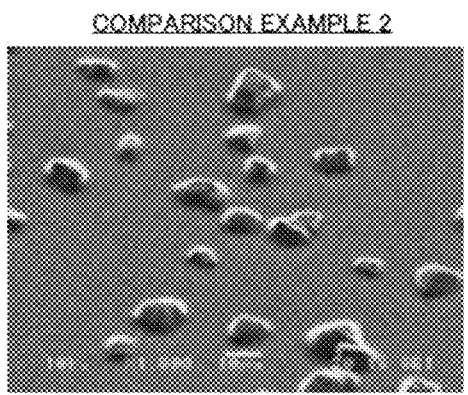
Figure 11E:
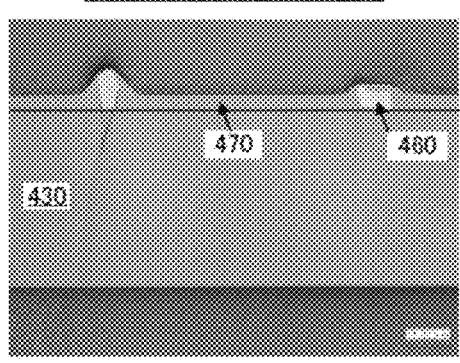

As shown in FIG. 10B, an abrasive film 420 of Comparison Examples 2, 3 includes a base film 430 and a surface layer 470. The base film 430 corresponds to the base film 30 of the abrasive film 20, and the surface layer 470 corresponds to the second layer 50 of the abrasive film 20. Namely, the abrasive film 420 does not have a layer which corresponds to the first layer 40 of the abrasive film 20. Abrasive grains 460 are held in the surface layer 470 in such a state that the abrasive grains 460 are not stacked in a direction of a thickness. However, a part of a surface of the abrasive film 460 is in contact with the base film 430, and therefore, as with Comparison Example 1, compared with the abrasive film 20, the holding force of the abrasive grains 460 and the bonding strength between the base film 430 and the surface layer 470 are reduced. Moreover, since a first layer like the first layer 40 of the abrasive film 20 is not formed on the base film 430, the abrasive films 460 cannot sink into a base film 430 side of the surface layer 470. As a result, projecting heights of the abrasive grains 460 having large grain sizes and the abrasive grains 460 having small grain sizes do not become uniform.

FIG. 11 shows showing the results of observation of Example 2 and Comparison Examples 1, 2 (refer to FIG. 10). FIG. 11A shows a surface of Example 2, and FIG. 11B shows a section of Example 2. It can be confirmed from FIGS. 11A and 11B that projecting heights of the abrasive grains 60 are almost uniform in Example 2. FIG. 11C shows a surface of Comparison Example 1. It can be confirmed from FIG. 11C that in Comparison Example 1, there are a number of abrasive grains 360 which aggregate. FIG. 11D shows a surface of Comparison Example 2, and FIG. 11E shows a section of Comparison Example 2. It can be confirmed from FIGS. 11D and 11E that the projecting heights of the abrasive grains 460 are not uniform in Comparison Example 2. It should be noted that in FIG. 11B, a boundary line between the first and second layer 40, 50 and the base film 30 is shown in an exaggerated fashion in consideration of visibility. This is also true with FIG. 11E.

The surfaces and sections as shown in FIG. 11 can be observed by the use of a laser microscope or a scanning electron microscope (SEM). To observe a section of such a sample, a resin-embedded abrasive film can be mechanically abraded to produce a section for observation. Here, the "resin-embedded abrasive film" means an abrasive film as a sample which is embedded in a resin so as to be held in a stable fashion.

Figure 12:
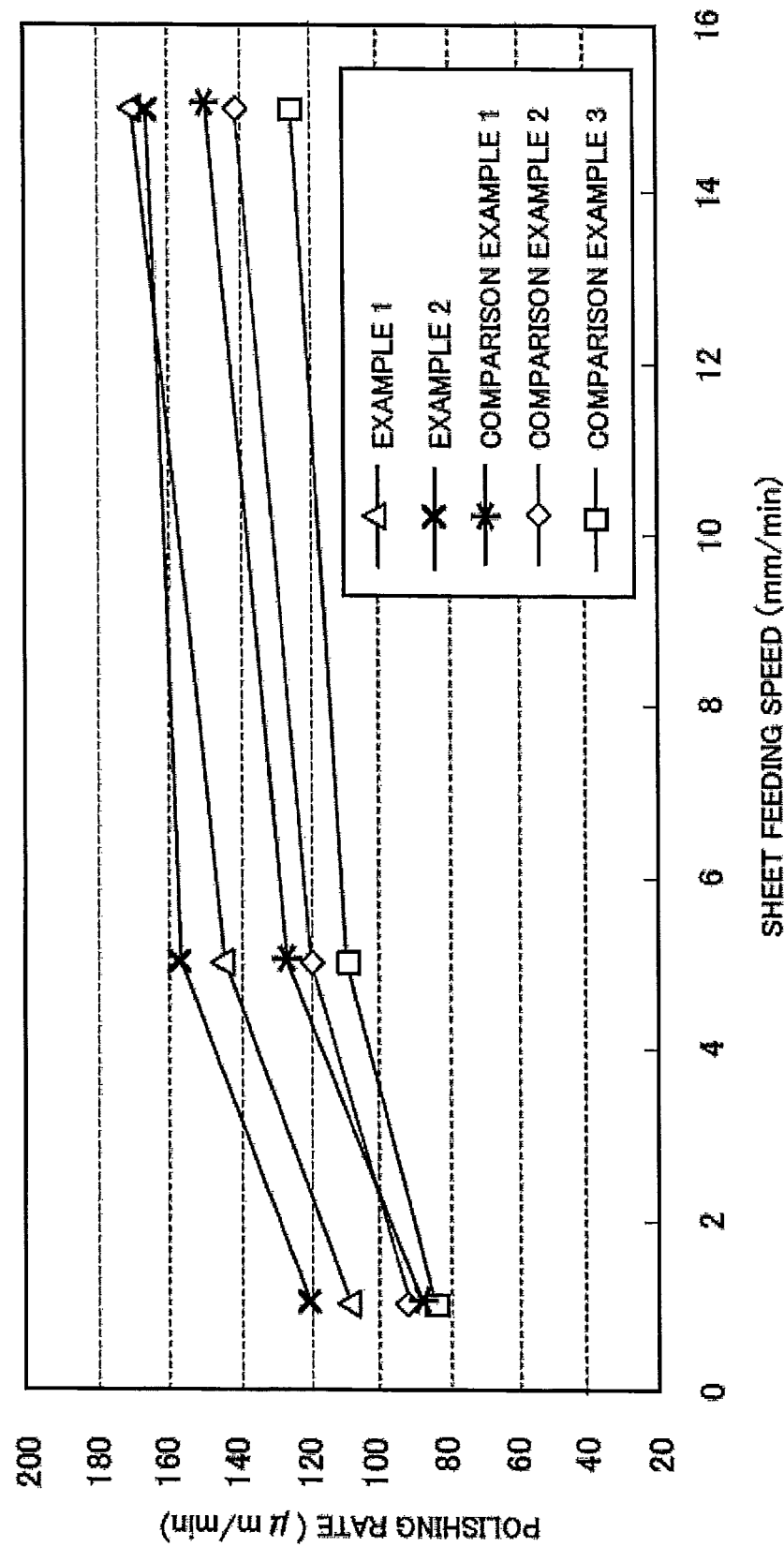
FIG. 12 is a diagram showing the results of the polishing tests (on a relation between sheet feed speed and polishing rate)

FIG. 12 shows the results of polishing tests carried out on the samples shown in FIG. 10. In the polishing tests, outer circumferential (end face) portions of silicon wafers having a diameter of 200 mm were polished, and polishing rates (variations in diameter) and surface roughness index values were measured. The polishing tests were carried out in a way described below. Firstly, a wafer was disposed horizontally on a polishing device, and was caused to be attracted and held to a rotating table. Next, the abrasive film was pushed from a rear thereof by a rubber pad while the abrasive film was fed minutely in a vertical direction, and the abrasive film was pressed against an end portion of the wafer perpendicularly for a predetermined period of time to polish the end portion. Then, a polishing rate was obtained from a change in wafer diameter before and after the working (polishing) step and the working time.

The polishing conditions of the polishing tests were as below:
(1) Polishing Load (pressure applied from the rubber pad): 12N
(2) Rotational Speed of Wafer: 500 rpm
(3) Polishing Time: 150 seconds
(4) Sheet Feeding Speeds: 1 mm/min, 5 mm/min, 15 mm/min As shown in FIG. 12, Examples 1, 2 (the abrasive film 20) provided larger polishing rates than those of Comparison Examples 1 to 3 at any of the three sheet feeding speeds. In particular, under the condition where the sheet feeding speed was 1 mm/min, it could be confirmed that the polishing rate was enhanced by on the order of 50% relative to Comparison Example 1, which is the conventional abrasive film. In this way, an increase in polishing rate can reduce the amount of an abrasive film used to polish one wafer, thereby making it possible to realize a reduction in cost.

In addition, the abrasive films 20 of Examples 1, 2 provided polishing rates which were almost equal to each other. This indicates that performances which are almost equal to each other can be obtained whether the abrasive grains whose grain size distribution is sharp or the abrasive grains whose grain size distribution is broad are used. Namely, according to the abrasive film 20 of this embodiment, the accuracy with which the abrasive grains 60 are classified does not have to be enhanced to improve the performance. Consequently, the fabrication costs of the abrasive film 20 can be reduced.

FIG. 13 shows the results of measuring surface roughness index values in the polishing tests carried out. The surface roughness index values measured are expressed in arithmetic mean roughness Ra (μm) and largest root depth Pv (μm) of section curve. An atomic force microscope (AFM) was used for measurement. As shown in FIG. 13, the results of the measurement of Examples 1, 2 were as good as that of Comparison Example 1 representing a conventional abrasive film.

Figure 14:
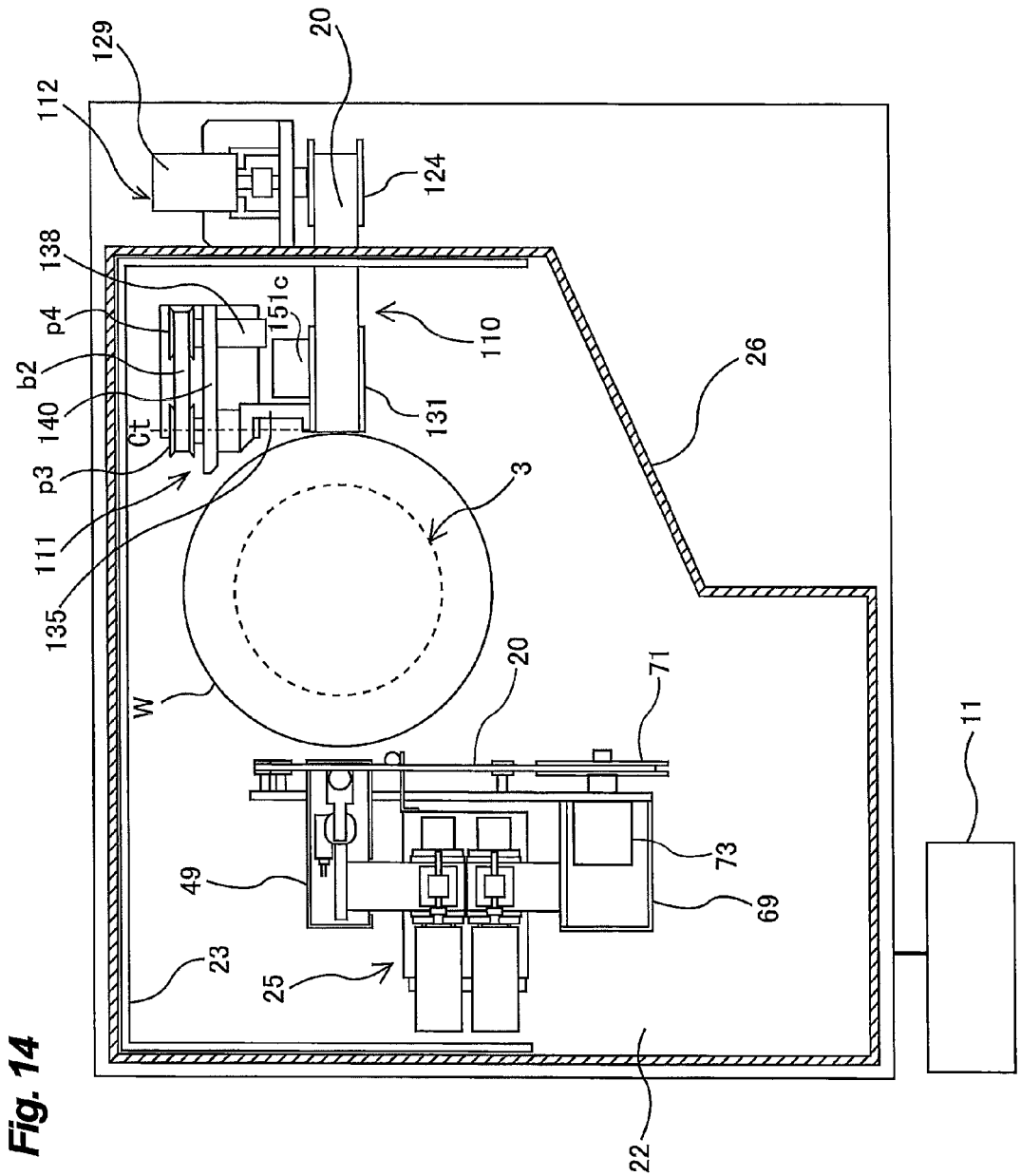
FIG. 14 is a plan view showing a polishing apparatus having an edge polishing unit capable of polishing an edge portion of a wafer and a bevel polishing unit capable of polishing a bevel portion of the wafer.
Figure 15:
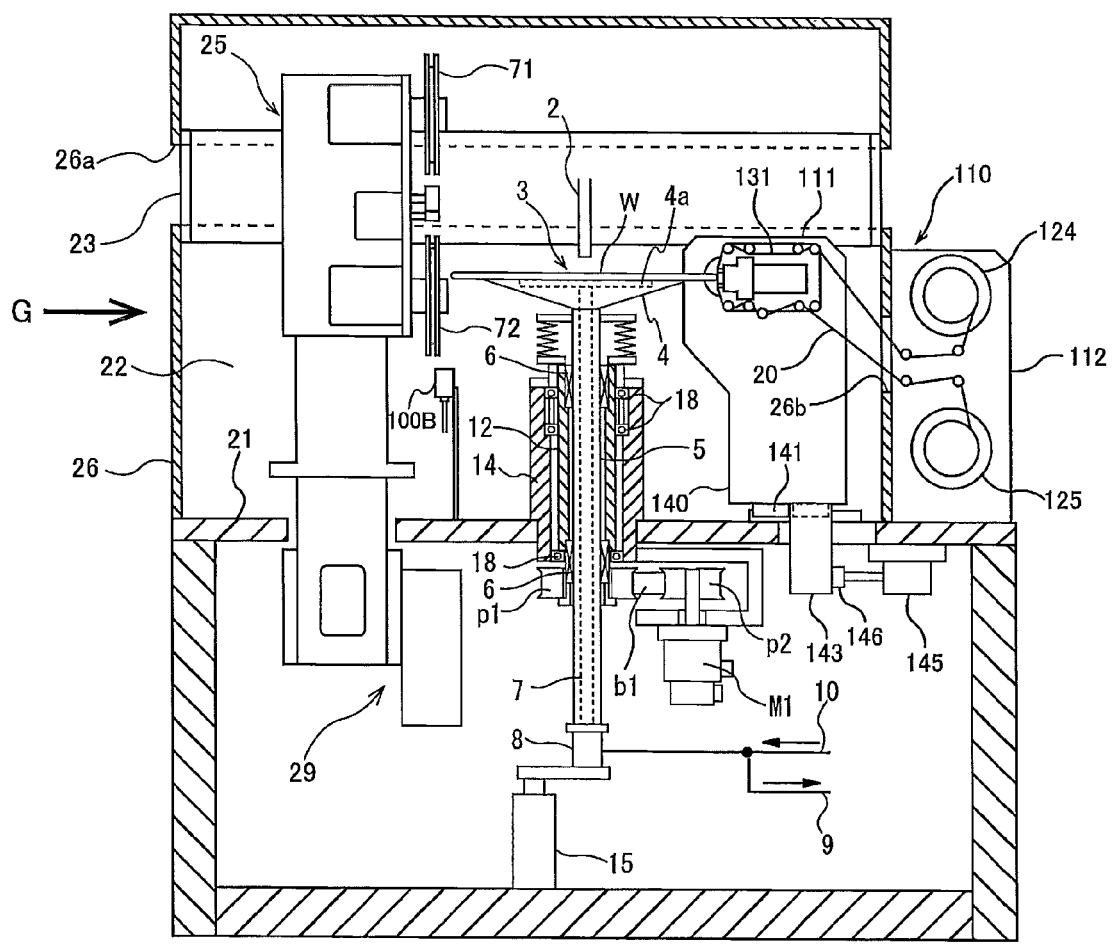
FIG. 15 is a vertical cross-sectional view of the polishing apparatus shown in FIG. 14.

Next, detailed structures of a polishing apparatus for performing a polishing method according to an embodiment will be described. FIG. 14 is a plan view showing a polishing apparatus having a polishing unit 25 (which will hereinafter be referred to as an edge polishing unit) capable of polishing an upper edge portion (see the symbol E1 in FIG. 1A and FIG. 1B) of a wafer and a bevel polishing unit 110 capable of polishing a bevel portion (see the symbol B in FIG. 1A and FIG. 1B) of the wafer. FIG. 15 is a vertical cross-sectional view of the polishing apparatus shown in FIG. 14.

The polishing apparatus includes a wafer holder 3 configured to horizontally hold a wafer W, which an object to be polished, and to rotate the wafer W, and a polishing-liquid supply nozzle 2 configured to supply a polishing liquid (e.g., pure water) onto an entirety of an upper surface of the wafer W held on the wafer holder 3. FIG. 15 shows a state in which the wafer holder 3 is holding the wafer W. This wafer holder 3 has a holding stage 4 configured to hold a lower surface of the wafer W by a vacuum suction, a hollow shaft 5 coupled to a central portion of the holding stage 4, and a motor M1 for rotating the hollow shaft 5. The wafer W is placed onto the holding stage 4 such that a center of the wafer W is aligned with a central axis of the hollow shaft 5. The holding stage 4 is located in a polishing chamber 22 which is formed by a partition 26 and a base plate 21.

Figure 16:
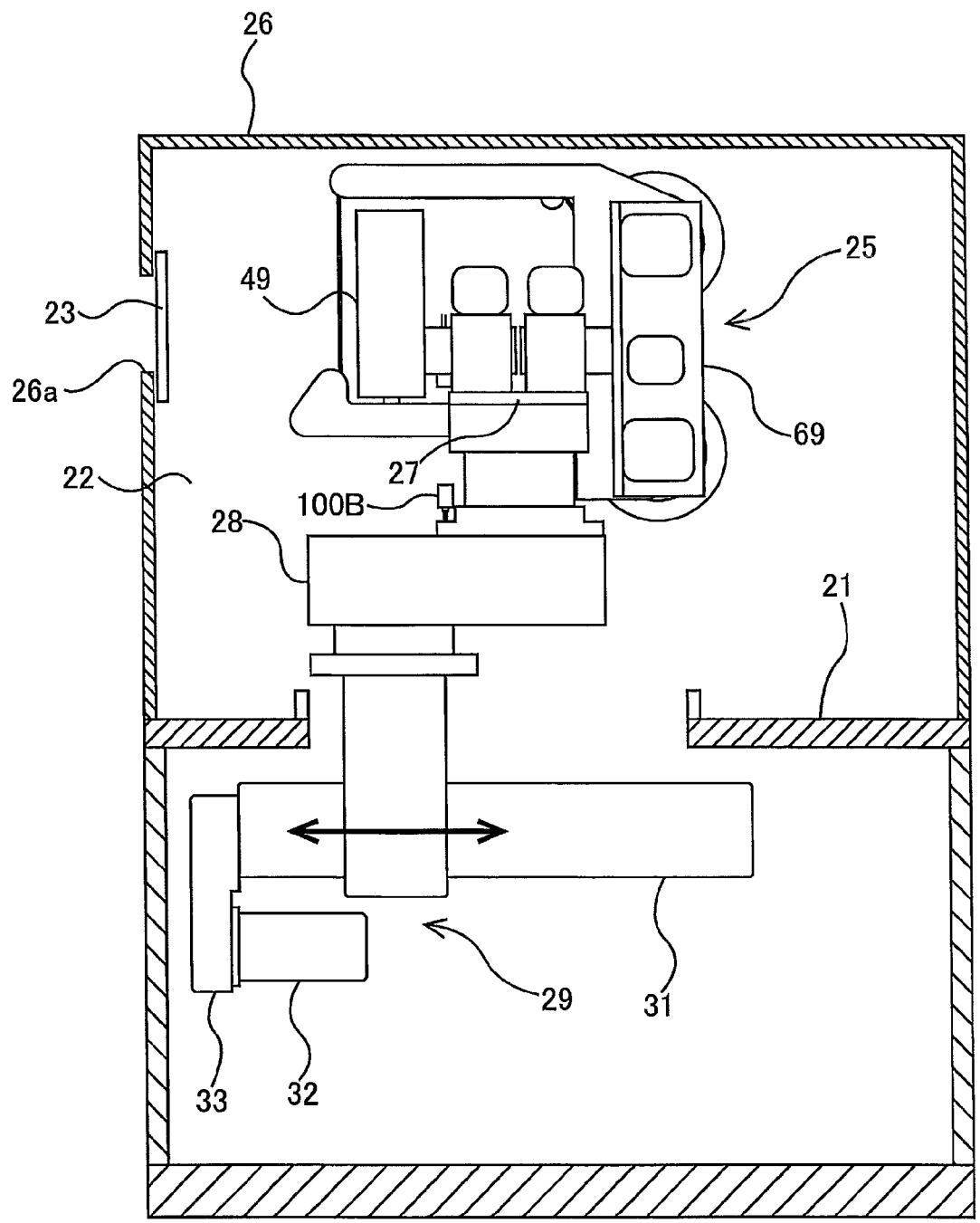
FIG. 16 is a view from a direction indicated by arrow G shown in FIG. 15.

As shown in FIGS. 14 through 16, the partition 26 has an entrance 26a through which the wafer W is transported into and removed from the polishing chamber 22. This entrance 26a is in the shape of a horizontal cutout and can be closed with a shutter 23.

The hollow shaft 5 is supported by ball spline bearings (i.e., linear motion bearings) 6 which allow the hollow shaft 5 to move vertically. The holding stage 4 has an upper surface with grooves 4a. These grooves 4a communicate with a communication passage 7 extending through the hollow shaft 5. The communication passage 7 is coupled to a vacuum line 9 via a rotary joint 8 provided on a lower end of the hollow shaft 5. The communication passage 7 is also coupled to a nitrogen-gas supply line 10 for use in releasing the wafer W from the holding stage 4 after processing. By selectively coupling the vacuum line 9 and the nitrogen-gas supply line 10 to the communication passage 7, the wafer W can be held on the upper surface of the holding stage 4 by the vacuum suction and can be released from the upper surface of the holding stage 4.

A pulley p1 is coupled to the hollow shaft 5, and a pulley p2 is mounted to a rotational shaft of the motor M1. The hollow shaft 5 is rotated by the motor M1 through the pulley p1, the pulley p2, and a belt b1 riding on these pulleys p1 and p2. The ball spline bearing 6 is a bearing that allows the hollow shaft 5 to move freely in its longitudinal direction. The ball spline bearings 6 are secured to a cylindrical casing 12. Therefore, the hollow shaft 5 can move linearly up and down relative to the casing 12, and the hollow shaft 5 and the casing 12 rotate together. The hollow shaft 5 is coupled to a pneumatic cylinder (or an elevating mechanism) 15, so that the hollow shaft 5 and the holding stage 4 are elevated and lowered by the pneumatic cylinder 15.

A cylindrical casing 14 is provided so as to surround the casing 12 in a coaxial arrangement. Radial bearings 18 are provided between the casing 12 and the casing 14, so that the casing 12 is rotatably supported by the radial bearings 18. With these structures, the wafer holder 3 can rotate the wafer W about its central axis and can elevate and lower the wafer W along its central axis.

The polishing unit 25 for polishing the peripheral portion of the wafer W is provided radially outwardly of the wafer W held by the wafer holder 3. This polishing unit 25 is located in the polishing chamber 22. As shown in FIG. 16, the polishing unit 25 in its entirety is secured to a mount base 27, which is coupled to a polishing-unit moving mechanism 29 via an arm block 28.

The polishing-unit moving mechanism 29 has a ball screw mechanism 31 that slidably holds the arm block 28, a motor 32 for driving the ball screw mechanism 31, and a power transmission mechanism 33 that couples the ball screw mechanism 31 and the motor 32 to each other. The power transmission mechanism 33 is constructed by pulleys, a belt, and the like. When the motor 32 is set in motion, the ball screw mechanism 31 moves the arm block 28 in directions indicated by arrows in FIG. 16 to thereby move the entirety of the polishing unit 25 in a tangential direction of the wafer W. This polishing-unit moving mechanism 29 also serves as an oscillation mechanism for oscillating the polishing unit 25 at a predetermined amplitude and a predetermined speed.

The polishing unit 25 includes a polishing head 49 for polishing the peripheral portion of the wafer W using the abrasive film 20, and an abrasive-film supply and collection mechanism 69 for supplying the abrasive film 20 to the polishing head 49 and collecting the abrasive film 20 from the polishing head 49. The polishing head 49 is an edge polishing head for polishing the upper edge portion (see the symbol E1 in FIG. 1A and FIG. 1B) of the wafer W by pressing the polishing surface of the abrasive film 20 downwardly against the peripheral portion of the wafer W.

Figure 17:
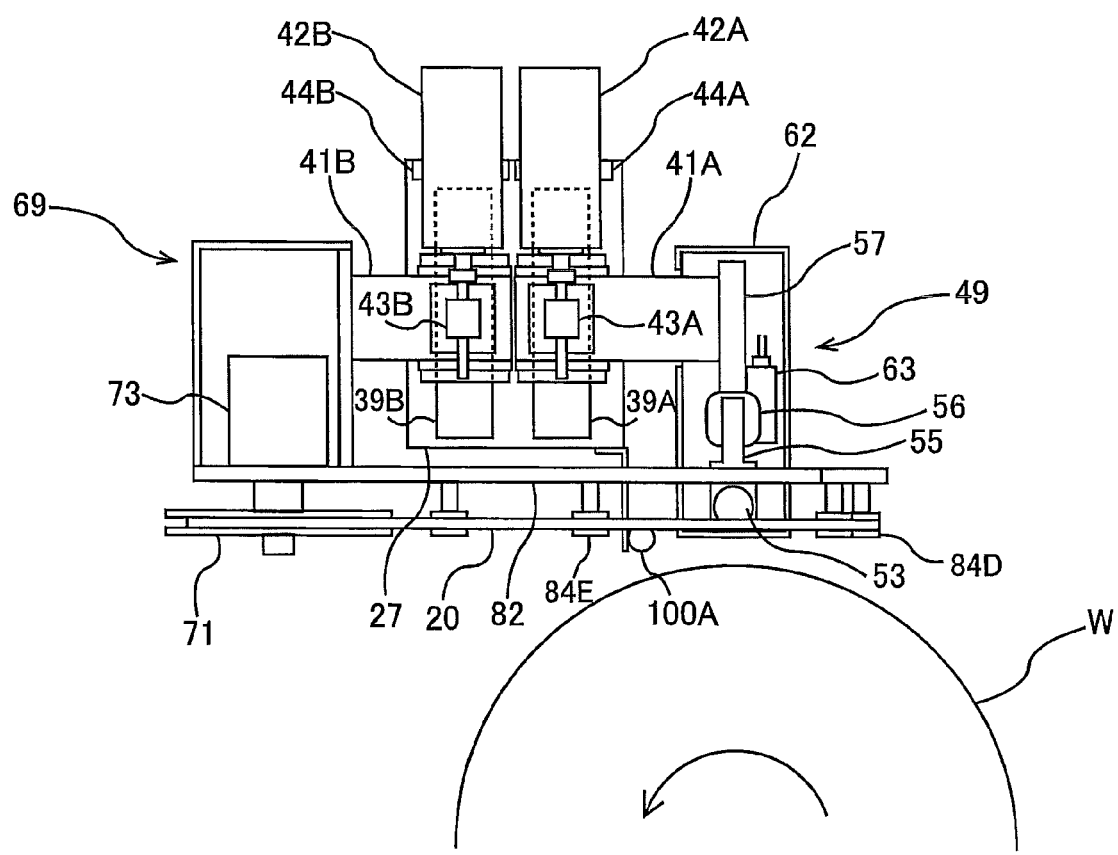
FIG. 17 is a plan view of a polishing head and an abrasive-film supply and collection mechanism.
Figure 18:
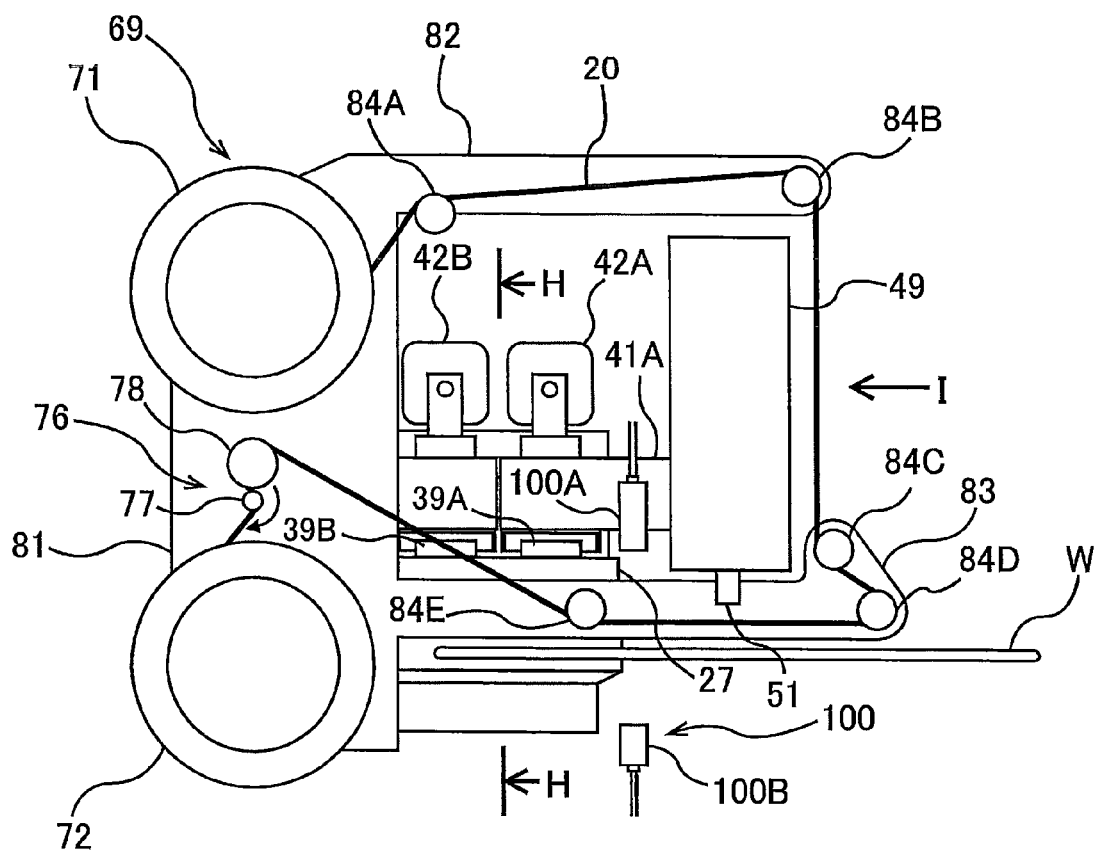
FIG. 18 is a front view of the polishing head and the abrasive-film supply and collection mechanism.
Figure 19:
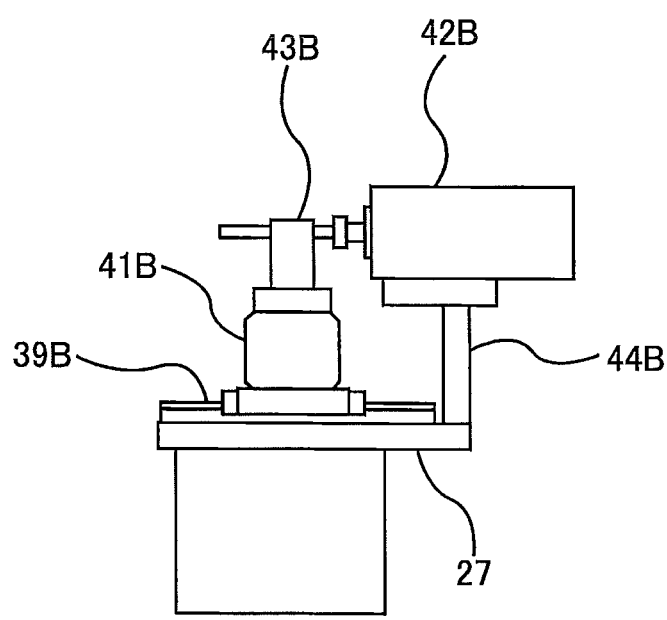
FIG. 19 is a cross-sectional view taken along line H-H in FIG. 18.
Figure 20:
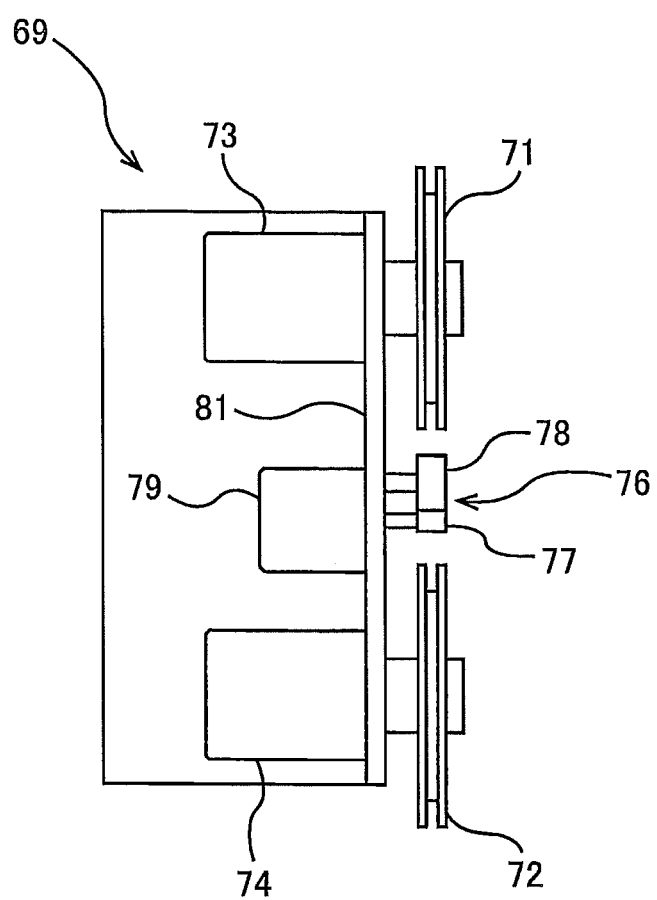
FIG. 20 is a side view of the abrasive-film supply and collection mechanism shown in FIG. 18.
Figure 21:
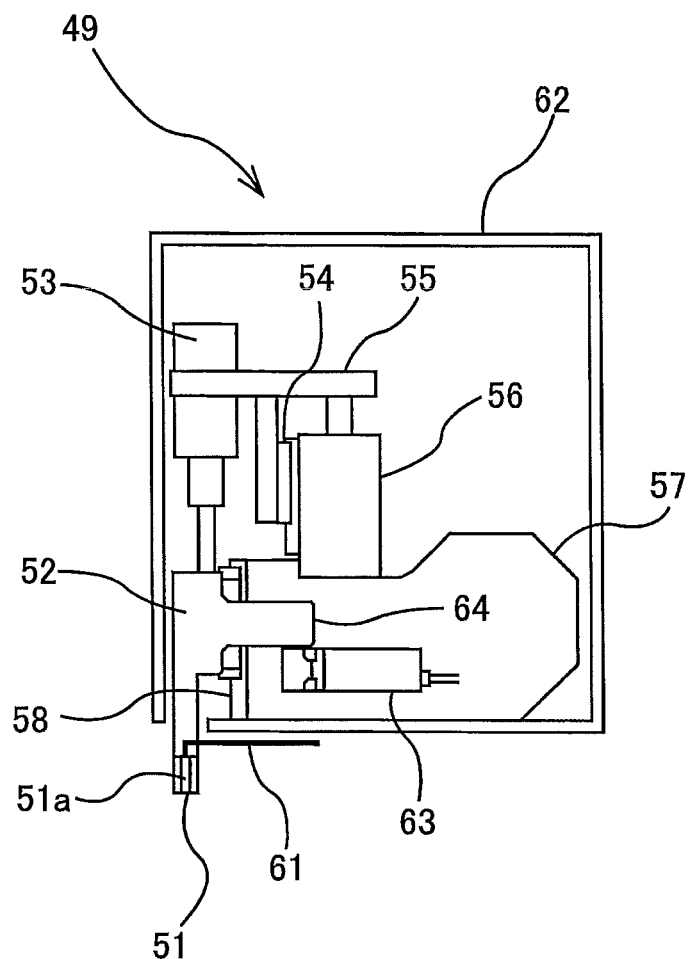
FIG. 21 is a vertical cross-sectional view of the polishing head as viewed from a direction indicated by arrow I in FIG. 18.

FIG. 17 is a plan view of the polishing head 49 and the abrasive-film supply and collection mechanism 69, FIG. 18 is a front view of the polishing head 49 and the abrasive-film supply and collection mechanism 69, FIG. 19 is a cross-sectional view taken along line H-H in FIG. 18, FIG. 20 is a side view of the abrasive-film supply and collection mechanism 69 shown in FIG. 18, and FIG. 21 is a vertical cross-sectional view of the polishing head 49 as viewed from a direction indicated by arrow I in FIG. 18.

Two linear motion guides 39A and 39B, which extend parallel to the radial direction of the wafer W, are disposed on the mount base 27. The polishing head 49 and the linear motion guide 39A are coupled to each other via a coupling block 41A. Further, the polishing head 49 is coupled to a motor 42A and a ball screw 43A for moving the polishing head 49 along the linear motion guide 39A (i.e., in the radial direction of the wafer W). More specifically, the ball screw 43A is secured to the coupling block 41A, and the motor 42A is secured to the mount base 27 through a support member 44A. The motor 42A is configured to rotate a screw shaft of the ball screw 43A, so that the coupling block 41A and the polishing head 49 (which is coupled to the coupling block 41A) are moved along the linear motion guide 39A. The motor 42A, the ball screw 43A, and the linear motion guide 39A constitute a first moving mechanism for moving the polishing head 49 in the radial direction of the wafer W held on the wafer holder 3.

Similarly, the abrasive-film supply and collection mechanism 69 and the linear motion guide 39B are coupled to each other via a coupling block 41B. Further, the abrasive-film supply and collection mechanism 69 is coupled to a motor 42B and a ball screw 43B for moving the abrasive-film supply and collection mechanism 69 along the linear motion guide 39B (i.e., in the radial direction of the wafer W). More specifically, the ball screw 43B is secured to the coupling block 41B, and the motor 42B is secured to the mount base 27 through a support member 44B. The motor 42B is configured to rotate a screw shaft of the ball screw 43B, so that the coupling block 41B and the abrasive-film supply and collection mechanism 69 (which is coupled to the coupling block 41B) are moved along the linear motion guide 39B. The motor 42B, the ball screw 43B, and the linear motion guide 39B constitute a second moving mechanism for moving the abrasive-film supply and collection mechanism 69 in the radial direction of the wafer W held on the wafer holder 3.

As shown in FIG. 21, the polishing head 49 has a pressing member 51 for pressing the abrasive film 20 against the wafer W, a pressing-member holder 52 that holds the pressing member 51, and a pneumatic cylinder 53 as an actuator configured to push down the pressing-member holder 52 (and the pressing member 51). The pneumatic cylinder 53 is held by a holding member 55. Further, the holding member 55 is coupled to a pneumatic cylinder 56 serving as a lifter via a linear motion guide 54 extending in the vertical direction. As a gas (e.g., air) is supplied to the pneumatic cylinder 56 from a non-illustrated gas supply source, the pneumatic cylinder 56 pushes up the holding member 55, whereby the holding member 55, the pneumatic cylinder 53, the pressing-member holder 52, and the pressing member 51 are elevated along the linear motion guide 54.

The pneumatic cylinder 56 is secured to a mount member 57 that is fixed to the coupling block 41A. The mount member 57 and the pressing-member holder 52 are coupled to each other via a linear motion guide 58 extending in the vertical direction. When the pressing-member holder 52 is pushed down by the pneumatic cylinder 53, the pressing member 51 is moved downward along the linear motion guide 58 to thereby press the abrasive film 20 against the peripheral portion of the wafer W. The pressing member 51 is made of resin (e.g., PEEK (polyetheretherketone)), metal (e.g., stainless steel), or ceramic (e.g., SiC (silicon carbide)).

The pressing member 51 has through-holes 51a extending in the vertical direction. A vacuum line 61 is coupled to the through-holes 51a. This vacuum line 61 has a valve (not shown in the drawings) therein. By opening this valve, a vacuum is produced in the through-holes 51a of the pressing member 51. When the vacuum is produced in the through-holes 51a with the pressing member 51 in contact with an upper surface of the abrasive film 20, this upper surface of the abrasive film 20 is held on a lower surface of the pressing member 51. Only one through-hole 51a may be provided in the pressing member 51.

The pressing-member holder 52, the pneumatic cylinder 53, the holding member 55, the pneumatic cylinder 56, and the mount member 57 are housed in a box 62. A lower portion of the pressing-member holder 52 projects from a bottom of the box 62, and the pressing member 51 is attached to this lower portion of the pressing-member holder 52. A position sensor 63 for detecting a vertical position of the pressing member 51 is disposed in the box 62. This position sensor 63 is mounted to the mount member 57. A dog 64, which serves as a sensor target, is provided on the pressing-member holder 52. The position sensor 63 is configured to detect the vertical position of the pressing member 51 based on the vertical position of the dog 64.

Figure 22:
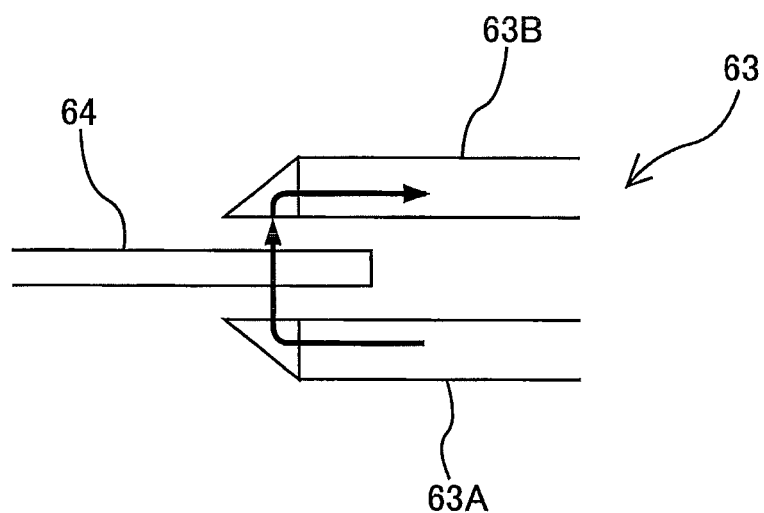
FIG. 22 is a view of a position sensor and a dog as viewed from above.

FIG. 22 is a view of the position sensor 63 and the dog 64 as viewed from above. The position sensor 63 has a light emitter 63A and a light receiver 63B. When the dog 64 is lowered together with the pressing-member holder 52 (and the pressing member 51), a part of light emitted from the light emitter 63A is interrupted by the dog 64. Therefore, the position of the dog 64, i.e., the vertical position of the pressing member 51, can be detected from a quantity of the light received by the light receiver 63B. The position sensor 63 shown in FIG. 22 is a so-called transmission optical sensor. However, other type of position sensor may be used.

The abrasive-film supply and collection mechanism 69 has a supply reel 71 for supplying the abrasive film 20 and a collection reel 72 for collecting the abrasive film 20. The supply reel 71 and the collection reel 72 are coupled to tension motors 73 and 74, respectively. These tension motors 73 and 74 are configured to apply predetermined torque to the supply reel 71 and the collection reel 72 to thereby exert a predetermined tension on the abrasive film 20.

An abrasive-film advancing mechanism 76 is provided between the supply reel 71 and the collection reel 72. This abrasive-film advancing mechanism 76 has a film-advancing roller 77 for advancing the abrasive film 20, a nip roller 78 that presses the abrasive film 20 against the film-advancing roller 77, and a film-advancing motor 79 for rotating the film-advancing roller 77. The abrasive film 20 is interposed between the film-advancing roller 77 and the nip roller 78. By rotating the film-advancing roller 77 in a direction indicated by arrow in FIG. 18, the abrasive film 20 is advanced from the supply reel 71 to the collection reel 72.

The tension motors 73 and 74 and the film-advancing motor 79 are mounted to a pedestal 81. This pedestal 81 is secured to the coupling block 41B. The pedestal 81 has two support arms 82 and 83 extending from the supply reel 71 and the collection reel 72 toward the polishing head 49. A plurality of guide rollers 84A, 84B, 84C, 84D, and 84E for supporting the abrasive film 20 are mounted to the support arms 82 and 83. The abrasive film 20 is guided by these guide rollers 84A to 84E so as to surround the polishing head 49.

The extending direction of the abrasive film 20 is perpendicular to the radial direction of the wafer W as viewed from above. The two guide rollers 84D and 84E, which are located below the polishing head 49, support the abrasive film 20 such that the polishing surface of the abrasive film 20 is parallel to the surface (upper surface) of the wafer W. Further, the abrasive film 20 extending between these guide rollers 84D and 84E is parallel to the tangential direction of the wafer W. There is a gap in the vertical direction between the abrasive film 20 and the wafer W.

The polishing apparatus further has a film-edge detection sensor 100 for detecting a position of the edge of the abrasive film 20. This film-edge detection sensor 100 is a transmission optical sensor, as well as the above-described position sensor 63. The film-edge detection sensor 100 has a light emitter 100A and a light receiver 100B. The light emitter 100A is secured to the mount base 27 as shown in FIG. 17, and the light receiver 100B is secured to the base plate 21 that defines the polishing chamber 22 as shown in FIG. 15. This film-edge detection sensor 100 is configured to detect the position of the edge of the abrasive film 20 based on a quantity of the light received by the light receiver 100B.

Figure 23:
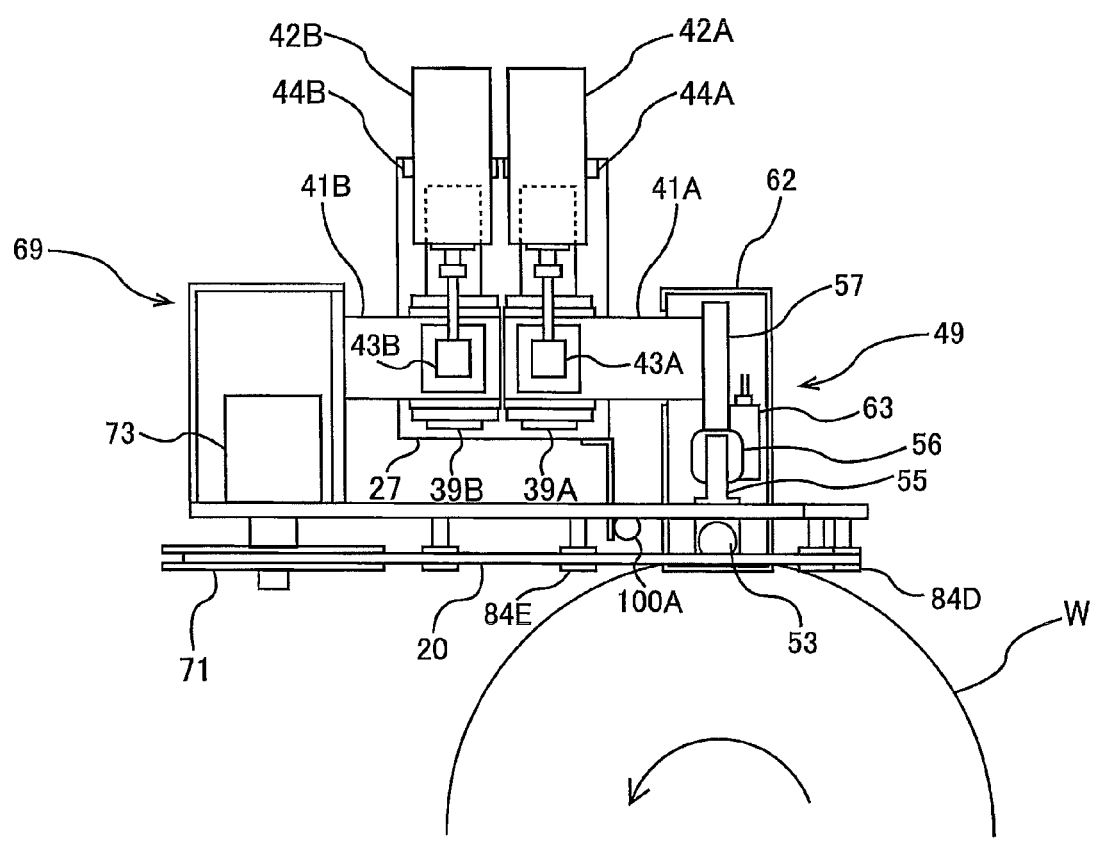
FIG. 23 is a view of the polishing head and the abrasive-film supply and collection mechanism that have been moved to predetermined polishing positions.
Figure 24:
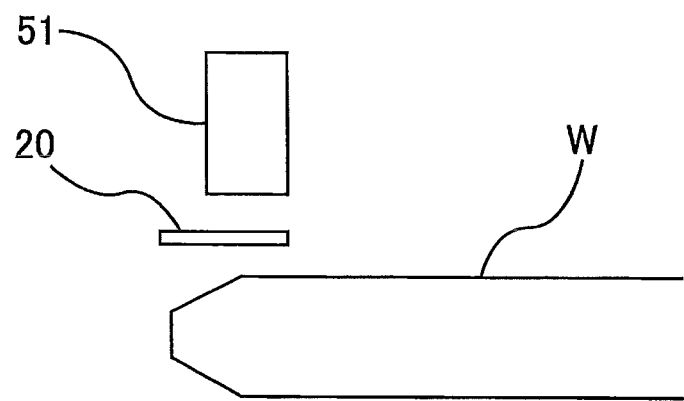
FIG. 24 is a schematic view of a pressing member, an abrasive film, and a wafer at their polishing positions as viewed from a lateral direction.
Figure 25:
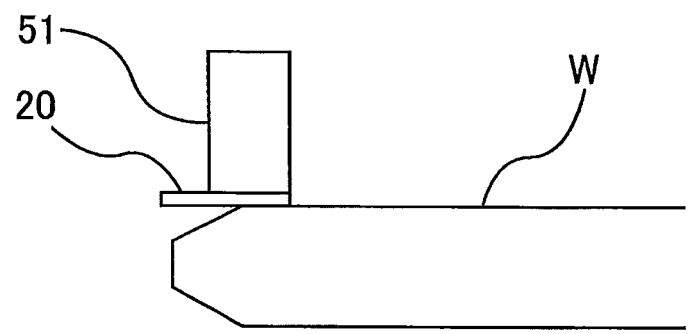
FIG. 25 is a view showing a state in which the pressing member is pressing the abrasive film against the wafer.

As shown in FIG. 23, when the wafer W is to be polished, the polishing head 49 and the abrasive-film supply and collection mechanism 69 are moved to their predetermined polishing positions, respectively, by the motors 42A and 42B and the ball screws 43A and 43B. The abrasive film 20 at the polishing position extends in the tangential direction of the wafer W. FIG. 24 is a schematic view of the polishing pad 51, the abrasive film 20, and the wafer W at the polishing positions as viewed from the lateral direction. As shown in FIG. 24, the abrasive film 20 is located above the peripheral portion of the wafer W, and the pressing member 51 is located above the abrasive film 20. FIG. 25 is a view showing a state in which the pressing member 51 is pressing the abrasive film 20 against the wafer W. As shown in FIG. 25, the edge of the pressing member 51 and the edge of the abrasive film 20 at their polishing positions coincide with each other. That is, the polishing head 49 and the abrasive-film supply and collection mechanism 69 are moved independently to their respective polishing positions such that the edge of the pressing member 51 and the edge of the abrasive film 20 coincide with each other.

Next, polishing operations of the polishing apparatus having the above-described structures will be described. The following operations of the polishing apparatus are controlled by an operation controller 11 shown in FIG. 14. The wafer W is held by the wafer holder 3 such that a film (e.g., a device layer) formed on the surface thereof faces upward, and further the wafer W is rotated about its center. A liquid (e.g., pure water) is supplied onto the center of the rotating wafer W from a liquid supply nozzle (not shown). The pressing member 51 of the polishing head 49 and the abrasive film 20 are moved to the predetermined polishing positions, respectively, as shown in FIG. 24.

Figure 26A:
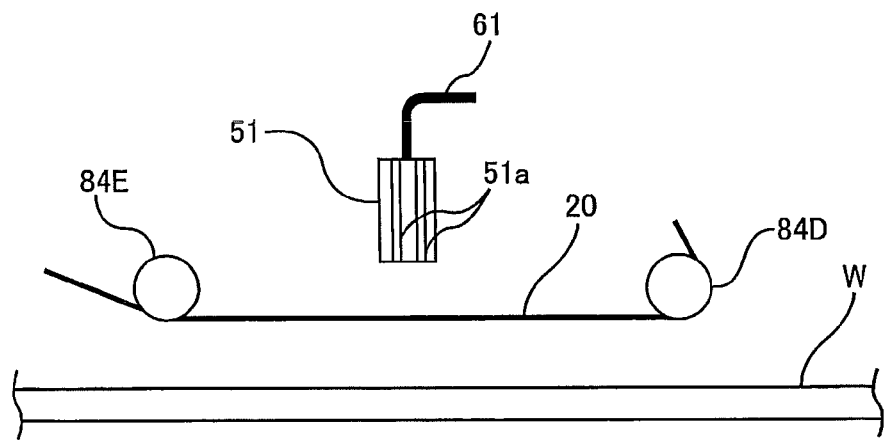
FIG. 26A is a view of the abrasive film and the pressing member at the polishing positions as viewed from a radial direction of the wafer.
Figure 26B:
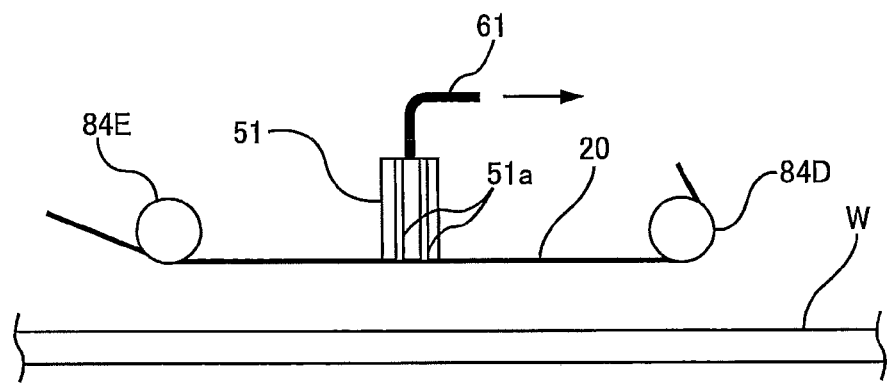
FIG. 26B is a view showing a state in which a lower surface of the pressing member is in contact with an upper surface of the abrasive film.
Figure 26C:
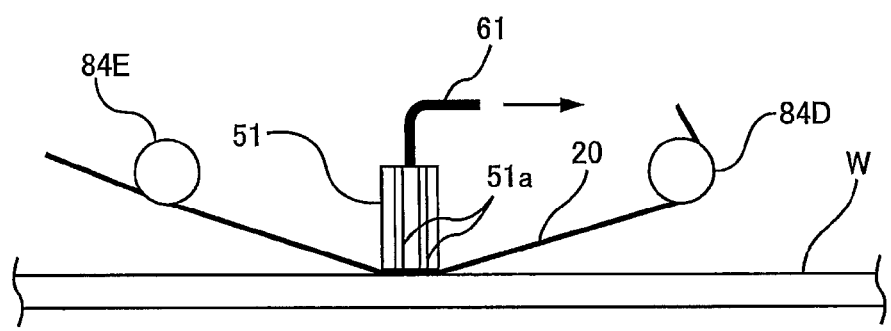
FIG. 26C is a view showing a state in which the pressing member is pressing the abrasive film downwardly against the wafer.

FIG. 26A is a view of the abrasive film 20 and the pressing member 51 at the polishing positions as viewed from the radial direction of the wafer W. The pressing member 51 shown in FIG. 26A is in an upper position as a result of being elevated by the pneumatic cylinder 56 (see FIG. 21). In this position, the pressing member 51 is located above the abrasive film 20. Subsequently, the operation of the pneumatic cylinder 56 is stopped and as a result a piston rod thereof is lowered. The pressing member 51 is lowered until its lower surface contacts the upper surface of the abrasive film 20 as shown in FIG. 26B. In this state, the vacuum is produced in the through-holes 51a of the pressing member 51 through the vacuum line 61 to enable the lower surface of the pressing member 51 to hold the abrasive film 20. While holding the abrasive film 20, the pressing member 51 is lowered by the pneumatic cylinder 53 (see FIG. 21) to press the polishing surface of the abrasive film 20 against the peripheral portion of the wafer W at a predetermined polishing load, as shown in FIG. 26C. The polishing load can be adjusted by the pressure of the gas supplied to the pneumatic cylinder 53.

The peripheral portion of the wafer W is polished by the sliding contact between the rotating wafer W and the abrasive film 20. In order to increase the polishing rate of the wafer W, the abrasive film 20 may be oscillated in the tangential direction of the wafer W by the polishing-unit moving mechanism 29 during polishing of the wafer W. During polishing, the liquid (e.g., pure water) is supplied onto the center of the rotating wafer W, so that the wafer W is polished in the presence of the water. The liquid, supplied to the wafer W, spreads over the upper surface of the wafer W in its entirety via a centrifugal force. This liquid can prevent polishing debris from contacting devices of the wafer W. As described above, during polishing, the abrasive film 20 is held on the pressing member 51 by the vacuum suction. Therefore, a change in relative position between the abrasive film 20 and the pressing member 51 is prevented. As a result, a polishing position and a polishing profile can be stable. Further, even when the polishing load is increased, the relative position between the abrasive film 20 and the pressing member 51 does not change. Therefore, a polishing time can be shortened.

Figure 27:
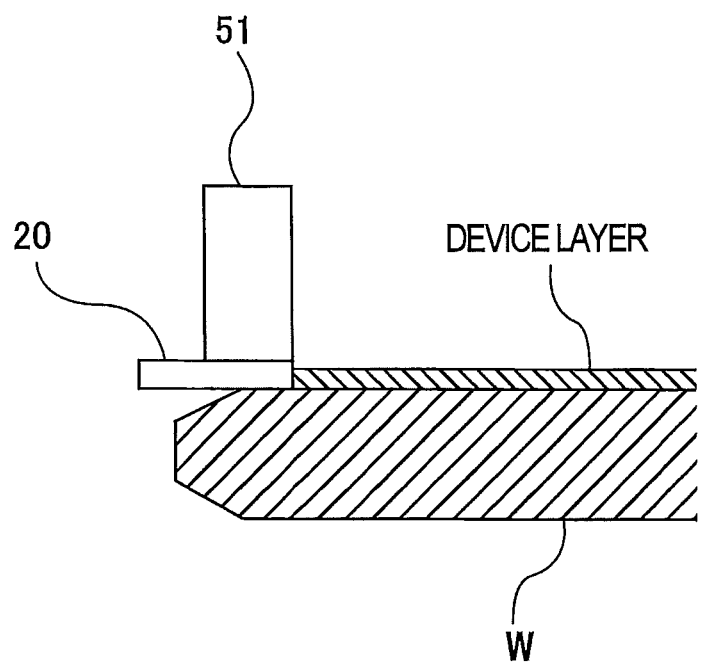
FIG. 27 is an enlarged view showing the peripheral portion of the wafer when being polished by the abrasive film.
Figure 37A:
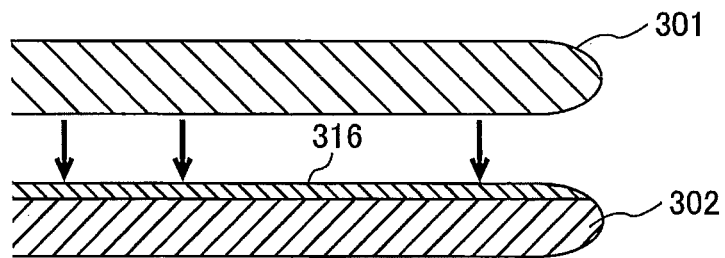
FIG. 37A, FIG. 37B, FIG. 37C, and FIG. 37D are diagrams illustrating a manufacturing process of an SOI wafer.
Figure 37B:
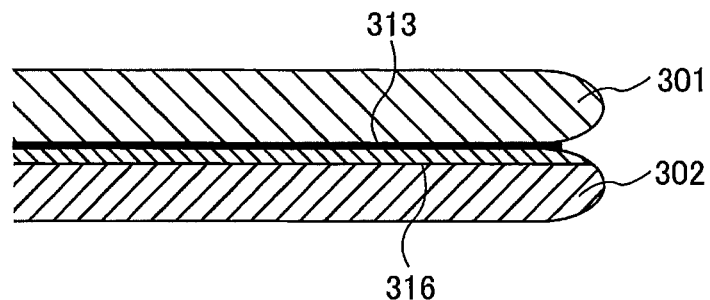
Figure 37C:
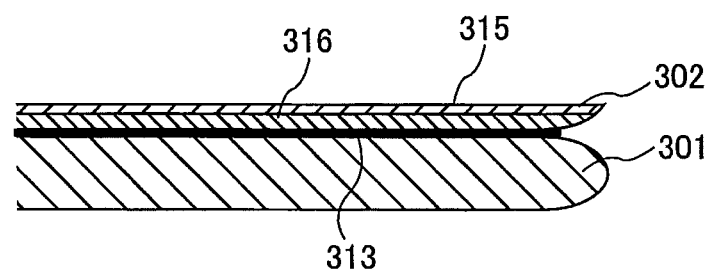
Figure 37D:
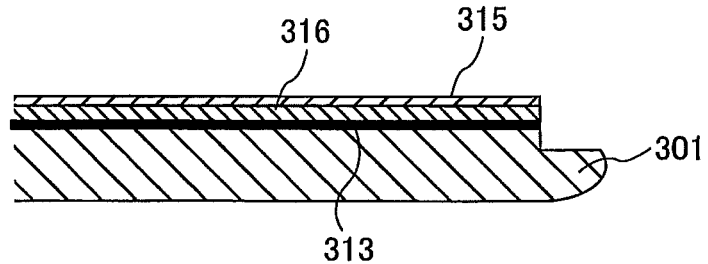

Because the abrasive film 20 is pressed downwardly by the pressing member 51, the abrasive film 20 can polish the upper edge portion (see the symbol E1 in FIG. 1A and FIG. 1B) of the wafer W. FIG. 27 is an enlarged view showing the peripheral portion of the wafer W when being polished by the abrasive film 20. As shown in FIG. 27, a flat portion, including the edge, of the abrasive film 20 is pressed against the peripheral portion of the wafer W, with the edge of the abrasive film 20 and the edge of the pressing member 51 coinciding with each other. As shown in FIG. 37D, the abrasive film 20 can form a right-angle stepped recess in the peripheral portion of the wafer W.

In the embodiment, the wafer W to be polished has a diameter in a range of 150 mm to 450 mm. The abrasive film 20 for use in polishing of the wafer W has a width in a range of 30 mm to 80 mm. The pressing member 51 has a width (i.e., a width in a direction perpendicular to the longitudinal direction of the abrasive film 20) ranging from a width that is smaller than the width of the abrasive film 20 by 4 mm to a width that is larger than the width of the abrasive film 20. Under these conditions, the abrasive film 20 polishes the peripheral portion, in particular the upper edge portion (see the symbol E1 in FIG. 1A and FIG. 1B), of the wafer W at a force in the range of 3 N to 10 N.

The abrasive film 20 according to the embodiment has a higher strength and a higher heat-resisting property, as compared with a conventional abrasive film made of PET (polyethylene terephthalate). Therefore, the abrasive film 20 is less likely to be damaged. In particular, since the peripheral portion of the wafer W is polished with a small force of 3 N to 10 N, the abrasive film 20 is subjected to less stress. Therefore, even when a hard film of the wafer W is polished, a replacement frequency of the abrasive film 20 can be low.

After the peripheral portion of the wafer W is polished with use of the abrasive film 20, a finishing abrasive film, instead of the abrasive film 20, may be set on the polishing head 49 and the abrasive-film supply and collection mechanism 69 for performing finish-polishing of the peripheral portion of the wafer W. The finishing abrasive film to be used may be the finishing abrasive film 24 described with reference to FIG. 2.

The vertical position of the pressing member 51 during polishing of the wafer W is detected by the position sensor 63. Therefore, a polishing end point can be detected from the vertical position of the pressing member 51. For example, polishing of the peripheral portion of the wafer W can be terminated when the vertical position of the pressing member 51 has reached a predetermined target position. This target position is determined according to a target amount of polishing.

When polishing of the wafer W is terminated, supply of the gas to the pneumatic cylinder 53 is stopped, whereby the pressing member 51 is elevated to the position shown in FIG. 26B. At the same time, the vacuum suction of the abrasive film 20 is stopped. Further, the pressing member 51 is elevated by the pneumatic cylinder 56 to the position shown in FIG. 26A. The polishing head 49 and the abrasive-film supply and collection mechanism 69 are moved to retreat positions shown in FIG. 17.

The polished wafer W is elevated by the wafer holder 3 and transported to the exterior of the polishing chamber 22 by hands of a non-illustrated transporting mechanism. Before polishing of the next wafer is started, the abrasive film 20 is advanced from the supply reel 71 to the collection reel 72 by a predetermined distance by the tape-advancing mechanism 76, so that a new polishing surface is used for polishing of the next wafer. Polishing of the wafer W may be performed while advancing the abrasive film 20 at a predetermined speed by the tape-advancing mechanism 76. In this case, the abrasive film 20 may not be held on the pressing member 51 by the vacuum suction. It is also possible to advance the abrasive film 20 by the abrasive-film advancing mechanism 76 while holding the abrasive film 20 on the pressing member 51 by the vacuum suction.

The abrasive film 20 is a long and narrow strip-shaped polishing tool. Although the width of the abrasive film 20 is basically constant throughout its entire length, there may be a slight variation in the width of the abrasive film 20 in some parts thereof. As a result, the position of the edge of the abrasive film 20 at its polishing position may vary from wafer to wafer. On the other hand, the position of the pressing member 51 at its polishing position is constant at all times. Thus, in order to enable the edge of the abrasive film 20 to coincide with the edge of the pressing member 51, the position of the edge of the abrasive film 20 is detected by the above-described film-edge detection sensor 100 before the abrasive film 20 is moved to its polishing position.

Figure 28A:
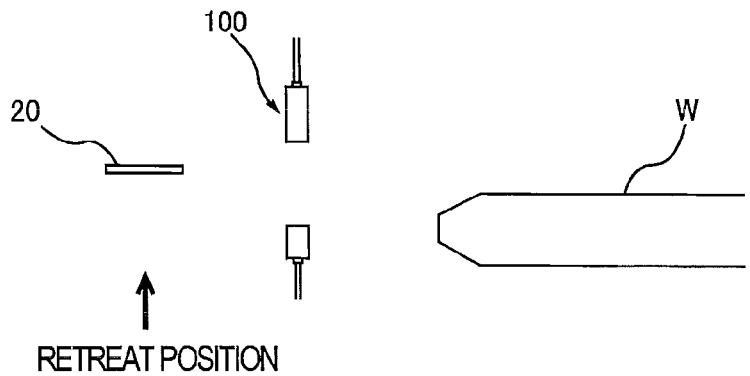
FIG. 28A, FIG. 28B, and FIG. 28C are diagrams illustrating operations for detecting an edge of the abrasive film.
Figure 28B:
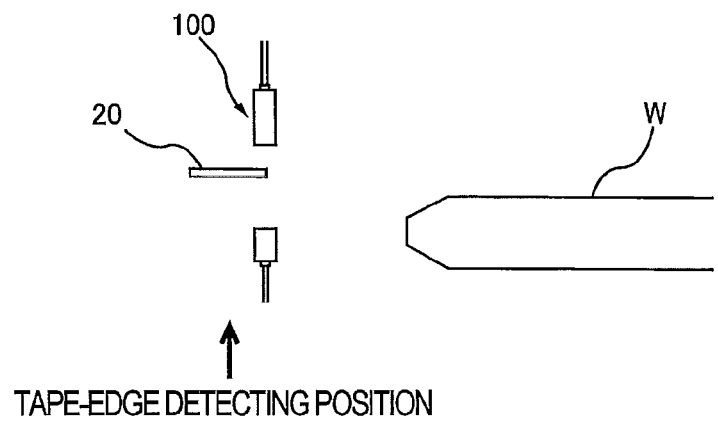
Figure 28C:
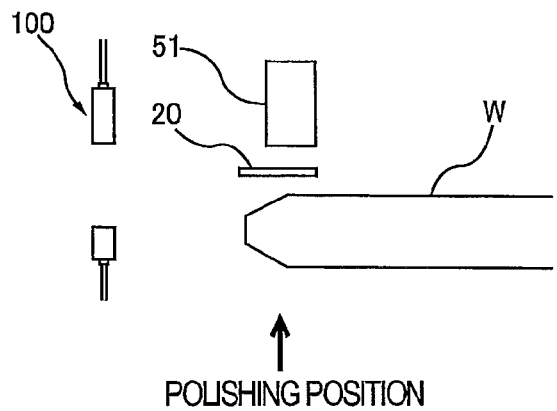

FIG. 28A through FIG. 28C are views illustrating operations for detecting the edge of the abrasive film 20. Prior to polishing of the wafer W, the abrasive film 20 is moved from a retreat position shown in FIG. 28A to a film-edge detecting position shown in FIG. 28B. In this film-edge detecting position, the position of the wafer-side edge of the abrasive film 20 is detected by the film-edge detection sensor 100. Then, as shown in FIG. 28C, the abrasive film 20 is moved to the polishing position such that the edge of the abrasive film 20 coincides with the edge of the pressing member 51. Because the abrasive film 20 is movable independently of the polishing head 49, the abrasive film 20 can be moved by a distance that can vary depending on the width of the abrasive film 20.

The position of the edge of the pressing member 51 at the polishing position is stored in advance in the operation controller 11 (see FIG. 14). Therefore, the operation controller 11 can calculate, from the detected edge position of the abrasive film 20 and the edge position of the pressing member 51, a travel distance of the abrasive film 20 for allowing the edge of the abrasive film 20 to coincide with the edge of the pressing member 51. In this manner, the travel distance of the abrasive film 20 is determined based on the detected position of the edge of the abrasive film 20. Therefore, the edge of the abrasive film 20 can be aligned with the edge of the pressing member 51 regardless of a variation in the width of the abrasive film 20.

As shown in FIG. 14 and FIG. 15, the bevel polishing unit 110 has a polishing head assembly 111 configured to press an abrasive film 20 against the bevel portion of the wafer W so as to polish the bevel portion, and an abrasive-film supply and recovery mechanism 112 for supplying the abrasive film 20 to the polishing head assembly 111. The polishing head assembly 111 is located in the polishing chamber 22, while the abrasive-film supply and collection mechanism 112 is located outside the polishing chamber 22.

Although the abrasive film 20 set in the bevel polishing unit 110 and the abrasive film 20 set in the above-described edge polishing unit 25 have different widths, both of these abrasive films 20 have the same structure shown in FIG. 3.

The abrasive-film supply and collection mechanism 112 has a supply reel 124 for supplying the abrasive film 20 to the polishing head assembly 111, and a collection reel 125 for collecting the abrasive film 20 that has been used in polishing of the wafer W. Motors 129 and 129 are coupled to the supply reel 124 and the collection reel 125, respectively (FIG. 14 shows only the motor 129 coupled to the supply reel 124). The motors 129 and 129 are configured to apply predetermined torque to the supply reel 124 and the collection reel 125 so as to exert a predetermined tension on the abrasive film 20.

The polishing head assembly 111 has a polishing head 131 for pressing the abrasive film 20 against the peripheral portion of the wafer W. The abrasive film 20 is supplied to the polishing head 131 such that a polishing surface of the abrasive film 20 faces the wafer W. The abrasive film 20 is supplied to the polishing head 131 from the supply reel 124 through an opening 26b formed in the partition 26. The abrasive film 20 that has been used in polishing of the wafer is collected by the collection reel 125 through the opening 26b.

The polishing head 131 is secured to one end of an arm 135, which is rotatable about an axis Ct extending parallel to the tangential direction of the wafer W. The other end of the arm 135 is coupled to a motor 138 via pulleys p3 and p4 and a belt b2. When the motor 138 rotates in a clockwise direction and a counterclockwise direction through a certain angle, the arm 135 rotates about the axis Ct through a certain angle. In this embodiment, the motor 138, the arm 135, the pulleys p3 and p4, and the belt b2 constitute a tilting mechanism for tilting the polishing head 131 with respect to the surface of the wafer W.

The tilting mechanism is mounted to a movable base 140. This movable base 140 is movably coupled to the base plate 21 via linear motion guides 141. The linear motion guides 141 extend linearly in the radial direction of the wafer W held on the wafer holder 3, so that the movable base 140 can move linearly in the radial direction of the wafer W. A connection plate 143, extending through the base plate 21, is secured to the movable base 140. A linear actuator 145 is coupled to the connection plate 143 via a joint 146. This linear actuator 145 is secured to the base plate 21 directly or indirectly.

The linear actuator 145 may comprise a pneumatic cylinder or a combination of a positioning motor and a ball screw. The linear actuator 145 and the linear motion guides 141 constitute a moving mechanism for linearly moving the polishing head 131 in the radial direction of the wafer W. Specifically, the moving mechanism is operable to move the polishing head 131 closer to and away from the wafer W along the linear motion guides 141. In contrast, the abrasive-film supply and collection mechanism 112 is fixed to the base plate 21.

Figure 29:
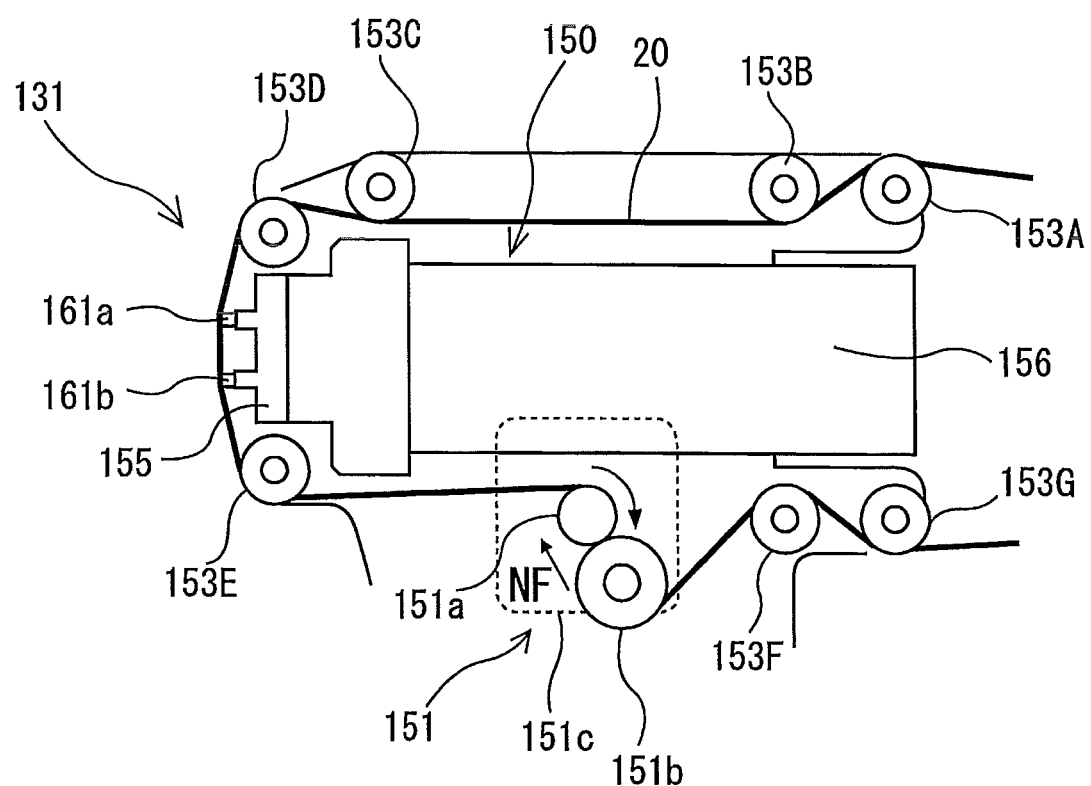
FIG. 29 is an enlarged view of the polishing head shown in FIG. 15.

FIG. 29 is an enlarged view of the polishing head 131 shown in FIG. 15. As shown in FIG. 29, the polishing head 131 has a pressing mechanism 150 configured to press the polishing surface of the abrasive film 20 against the wafer W at a predetermined force. The polishing head 131 further has a film-advancing mechanism 151 configured to advance the abrasive film 20 from the supply reel 124 to the collection reel 125. The polishing head 131 has plural guide rollers 153A, 153B, 153C, 153D, 153E, 153F, and 153G, which guide the abrasive film 20 such that the abrasive film 20 moves in a direction perpendicular to the tangential direction of the wafer W.

The film-advancing mechanism 151 of the polishing head 131 includes a film-advancing roller 151a, a nip roller 151b, and a motor 151c configured to rotate the film-advancing roller 151a. The motor 151c is mounted to a side surface of the polishing head 131. The film-advancing roller 151a is provided on a rotational shaft of the motor 151c. The nip roller 151b is adjacent to the film-advancing roller 151a. The nip roller 151b is supported by a non-illustrated mechanism, which biases the nip roller 151b in a direction indicated by arrow NF in FIG. 29 (i.e., in a direction toward the film-advancing roller 151a) so as to press the nip roller 151b against the film-advancing roller 151a.

As the motor 151c rotates in a direction indicated by arrow in FIG. 29, the film-advancing roller 151a is rotated to advance the abrasive film 20 from the supply reel 124 to the collection reel 125 via the polishing head 131. The nip roller 151b is configured to be rotatable about its own axis.

The pressing mechanism 150 includes a pressing member 155 located at the rear side of the abrasive film 20 and a pneumatic cylinder 156 configured to move the pressing member 155 toward the peripheral portion of the wafer W. The polishing load on the wafer W is regulated by controlling a pressure of a gas supplied to the pneumatic cylinder 156.

Figure 30:
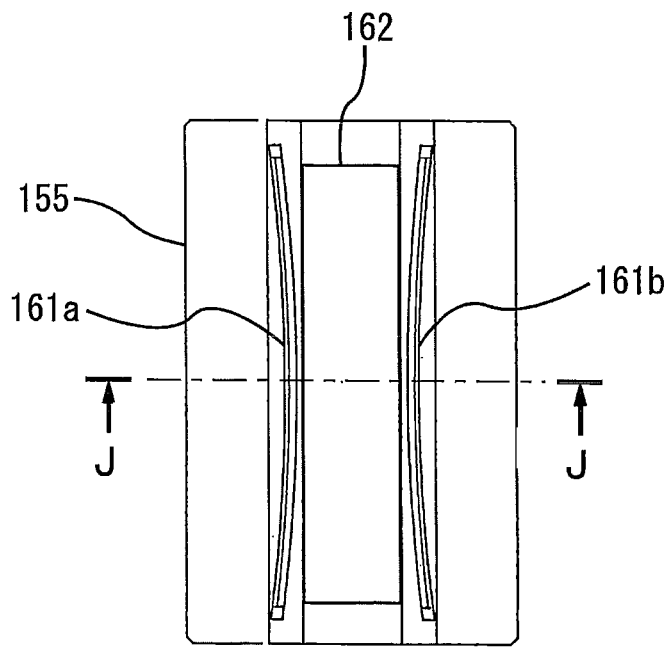
FIG. 30 is a front view of the pressing member shown in FIG. 29.
Figure 31:
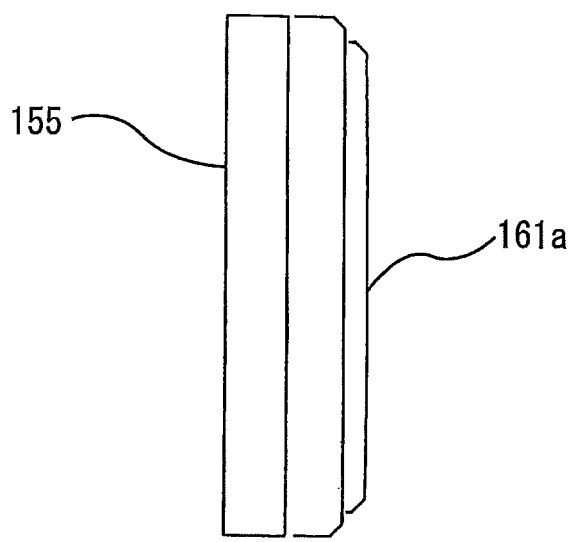
FIG. 31 is a side view of the pressing member shown in FIG. 30.
Figure 32:
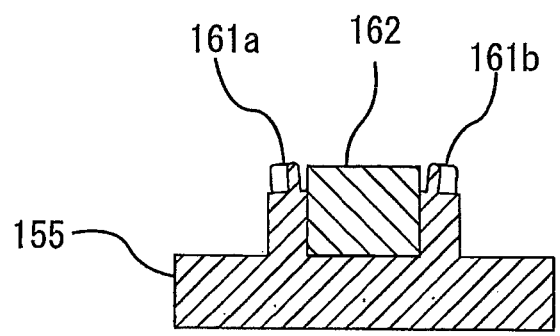
FIG. 32 is a cross-sectional view taken along line J-J in FIG. 30.

FIG. 30 is a front view of the pressing member 155 shown in FIG. 29, FIG. 31 is a side view of the pressing member 155 shown in FIG. 30, and FIG. 32 is a cross-sectional view taken along line J-J in FIG. 30. As shown in FIG. 30 through FIG. 32, the pressing member 155 has two protrusions 161a and 161b formed on a front surface thereof. These protrusions 161a and 161b are in a shape of rail and are arranged in parallel. The protrusions 161a and 161b are curved along the circumferential direction of the wafer W. More specifically, the protrusions 161a and 161b have a circular arc shape whose curvature is substantially the same as a curvature of the wafer W.

The two protrusions 161a and 161b are symmetrical about the rotational axis Ct. As shown in FIG. 30, the protrusions 161a and 161b are curved inwardly toward the rotational axis Ct as viewed from a front of the pressing member 155. The polishing head 131 is disposed such that a center line (i.e., the rotational axis Ct) extending between tip ends of the protrusions 161a and 161b coincides with a center of a thickness of the wafer W. The protrusions 161a and 161b are arranged such that the protrusions 161a and 161b are closer to the wafer W than the guide rollers 153D and 153E that are disposed at the front of the polishing head 131, so that the abrasive film 20 is supported from the rear side thereof by the protrusions 161a and 161b. The protrusions 161a and 161b are made from resin, such as PEEK (polyetheretherketone).

A pressing pad (or bevel pad) 162 is provided between the two protrusions 161a and 161b. This pressing pad 162 is made from closed-cell foam material (e.g., silicone rubber) having elasticity. A height of the pressing pad 162 is slightly lower than a height of the protrusions 161a and 161b. When the pressing member 155 is moved toward the wafer W by the pneumatic cylinder 156 with the polishing head 131 in the horizontal position, the pressing pad 162 presses the abrasive film 20 from the rear side thereof against the bevel portion of the wafer W.

Figure 33:
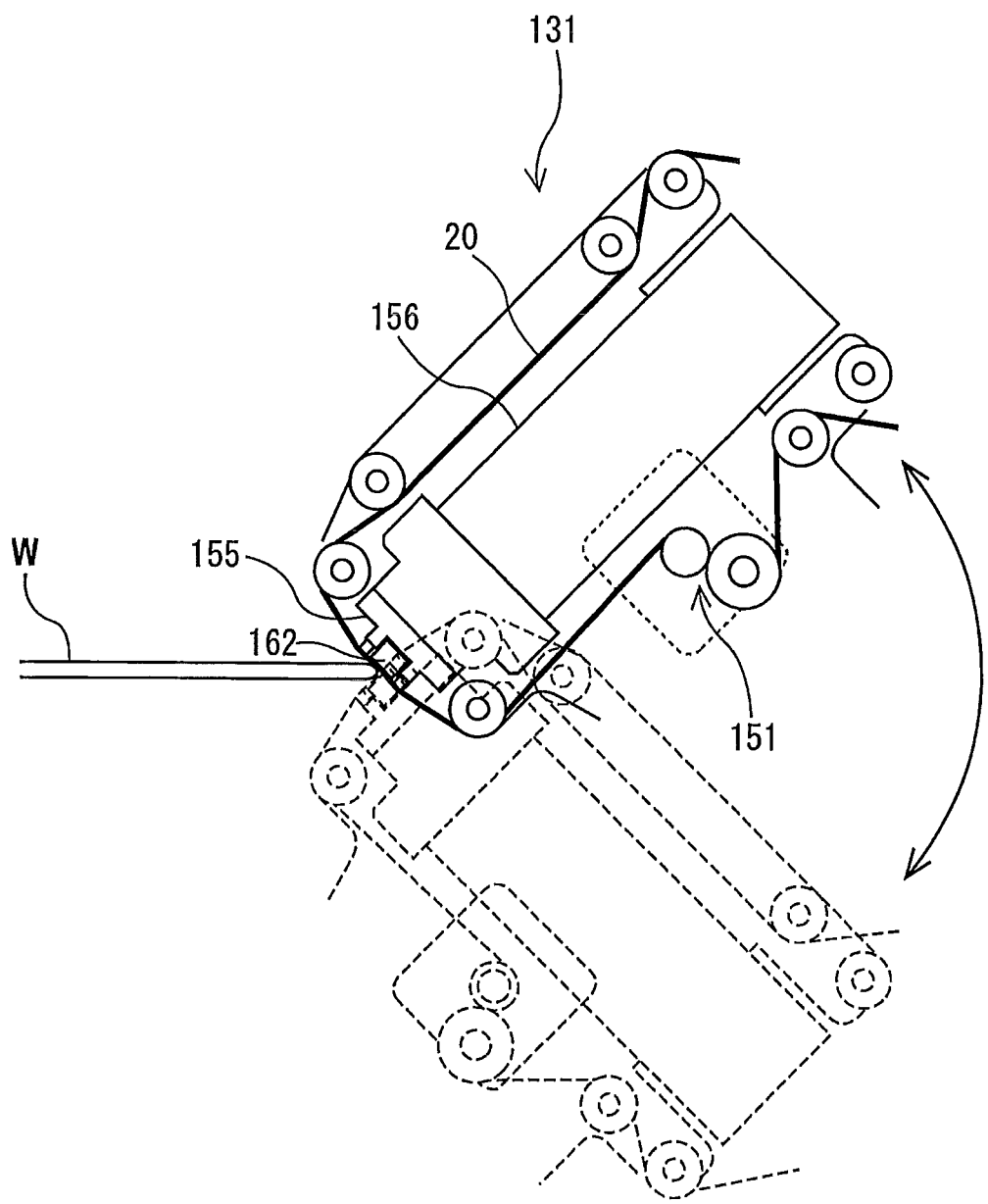
FIG. 33 is a view showing the bevel polishing unit when polishing the bevel portion of the wafer.
Figure 34:
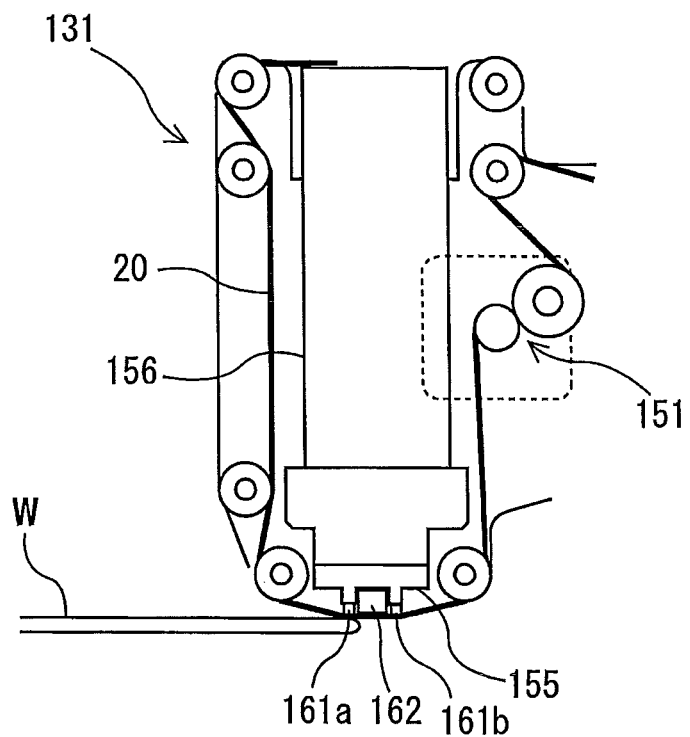
FIG. 34 is a view showing the bevel polishing unit when polishing an upper edge portion of the wafer.
Figure 35:
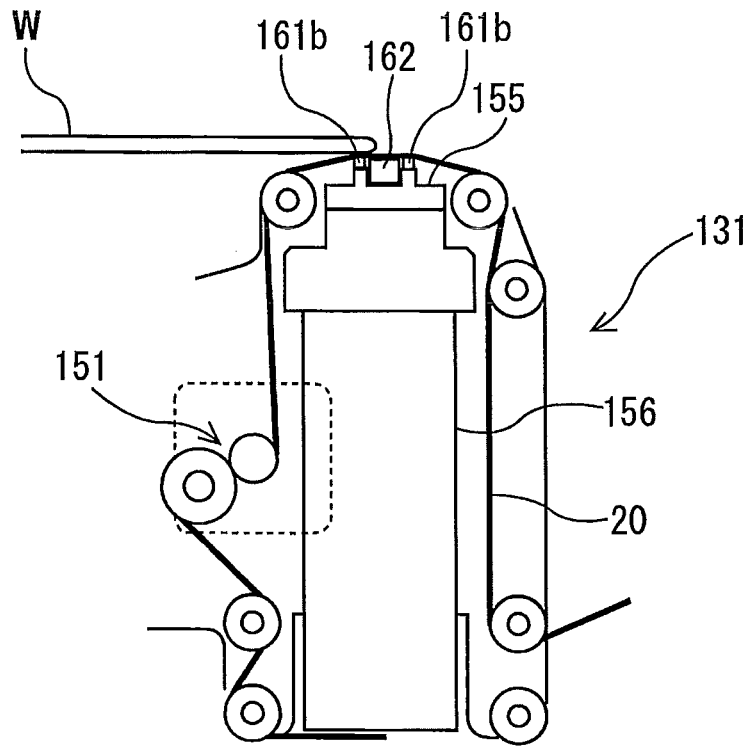
FIG. 35 is a view showing the bevel polishing unit when polishing a lower edge portion of the wafer.
Figure 36:
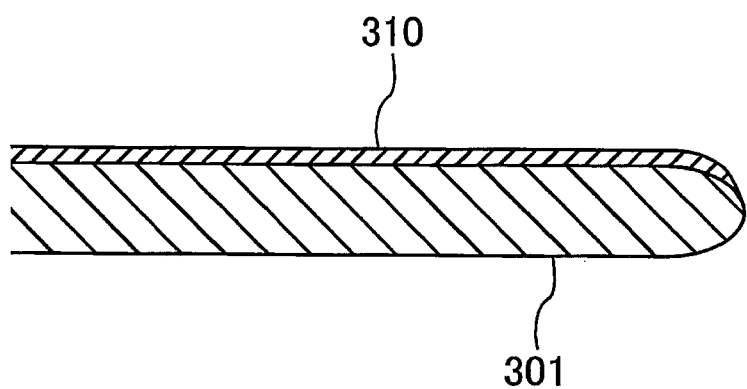
FIG. 36 is a cross-sectional view showing a wafer having a structure including a silicon substrate and an SiC film formed on the silicon substrate.

When polishing the bevel portion of the wafer W, the abrasive film 20 is pressed against the bevel portion by the pressing pad 162 while a tilt angle of the polishing head 131 is changed continuously by the above-described tilting mechanism, as shown in FIG. 33. During polishing, the abrasive film 20 is advanced at a predetermined speed by the film-advancing mechanism 151. Further, the polishing head 131 is capable of polishing the upper edge portion of the wafer W (see the symbol E1 in FIG. 1A and FIG. 1B). Specifically, as shown in FIG. 34, the polishing head 131 is inclined upward to allow the protrusion 161a to press the abrasive film 20 against the upper edge portion of the wafer W to thereby polish the upper edge portion. Subsequently, as shown in FIG. 35, the polishing head 131 is inclined downward to allow the protrusion 161b to press the abrasive film 20 against the lower edge portion of the wafer W (see the symbol E2 in FIG. 1A and FIG. 1B) to thereby polish the lower edge portion.

The polishing apparatus shown in FIG. 14 and FIG. 15 is configured to be able to polish the peripheral portion of the wafer W in its entirety including the edge portions and the bevel portion. For example, the bevel polishing unit 110 can polish the bevel portion of the wafer W, and subsequently the edge polishing unit 25 can polish the edge portions of the wafer W. In this polishing apparatus, the upper edge portion of the wafer W may be polished using either one or both of the edge polishing unit 25 and the bevel polishing unit 110. Although not shown in the drawings, a plurality of bevel polishing units 110 may be provided.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A polishing method using an abrasive film including a base film made of polyimide, a binder made of polyimide, and abrasive grains held by the binder, comprising:
   rotating a silicon substrate having a surface on which a silicon carbide film is formed; and
   removing the silicon carbide film from a peripheral portion of the silicon substrate by pressing the abrasive film at a low force against the silicon carbide film on the peripheral portion of the silicon substrate.

2. The polishing method according to claim 1, wherein said pressing the abrasive film is performed while causing a surface of the binder to exhibit a water repellency by a contact between the silicon carbide film and the binder.

3. The polishing method according to claim 1, further comprising:
   finish-polishing the peripheral portion of the silicon substrate by pressing a finishing abrasive film against the peripheral portion of the silicon substrate after said removing the silicon carbide film.

4. A polishing method using an abrasive film including a base film made of polyimide, a binder made of polyimide, and abrasive grains held by the binder, comprising:
   rotating an SOI wafer having two substrates which are bonded together by an adhesive; and
   removing the adhesive from a peripheral portion of the SOI wafer by pressing the abrasive film at a low force against the peripheral portion of the SOI wafer.

5. The polishing method according to claim 4, further comprising:
   finish-polishing the peripheral portion of the SOI wafer by pressing a finishing abrasive film against the peripheral portion of the SOI wafer after said removing the adhesive.

* * * * *